(12) United States Patent
Uno et al.

(10) Patent No.: US 8,836,147 B2
(45) Date of Patent: Sep. 16, 2014

(54) BONDING STRUCTURE OF MULTILAYER COPPER BONDING WIRE

(75) Inventors: Tomohiro Uno, Tokyo (JP); Takashi Yamada, Iruma (JP); Atsuo Ikeda, Iruma (JP)

(73) Assignee: Nippon Steel & Sumikin Materials Co., Ltd., Tokyo (JP)

( * ) Notice: Subject to any disclaimer, the term of this patent is extended or adjusted under 35 U.S.C. 154(b) by 0 days.

(21) Appl. No.: 13/877,224

(22) PCT Filed: Sep. 29, 2011

(86) PCT No.: PCT/JP2011/072397
§ 371 (c)(1),
(2), (4) Date: Apr. 1, 2013

(87) PCT Pub. No.: WO2012/043727
PCT Pub. Date: Apr. 5, 2012

(65) Prior Publication Data
US 2013/0180757 A1    Jul. 18, 2013

(30) Foreign Application Priority Data
Oct. 1, 2010   (JP) .................................. 2010-224213

(51) Int. Cl.
| | | |
|---|---|---|
| H01L 23/48 | (2006.01) | |
| H01L 25/065 | (2006.01) | |
| B23K 20/00 | (2006.01) | |
| H01L 23/00 | (2006.01) | |
| H01B 1/02 | (2006.01) | |

(52) U.S. Cl.
CPC ............ H01B 1/026 (2013.01); H01L 25/0657 (2013.01); H01L 2924/01024 (2013.01); B23K 20/007 (2013.01); H01L 2224/76268 (2013.01); H01L 2924/01029 (2013.01); H01L 2224/45664 (2013.01); H01L 2924/01327 (2013.01); H01L 2224/48227 (2013.01); H01L 2224/45644 (2013.01); H01L 2225/0651 (2013.01); H01L 2224/48799 (2013.01); H01L 2924/01045 (2013.01); H01L 2224/45565 (2013.01); H01L 2924/01006 (2013.01); H01L 2224/32145 (2013.01); H01L 2924/01078 (2013.01); H01L 2224/45669 (2013.01); H01L 2924/01014 (2013.01); H01L 2924/01013 (2013.01); H01L 2224/48599 (2013.01); H01L 24/43 (2013.01); H01L 2924/01046 (2013.01); H01L 2924/10253 (2013.01); H01L 2924/01033 (2013.01); H01L 2224/781 (2013.01); H01L 2224/4851 (2013.01); H01L 2924/01082 (2013.01); H01L 2924/01015 (2013.01); H01L 2224/85045 (2013.01); H01L 2224/48091 (2013.01); H01L 2224/4845 (2013.01); H01L 2924/01028 (2013.01); H01L 2924/01047 (2013.01); H01L 2224/05624 (2013.01); H01L 24/85 (2013.01); H01L 2924/01079 (2013.01); H01L 2224/73265 (2013.01); H01L 24/48 (2013.01); H01L 23/48 (2013.01); H01L 2224/45147 (2013.01); H01L 2224/45015 (2013.01); H01L 2924/12041 (2013.01); H01L 24/78 (2013.01); H01L 2224/45639 (2013.01); H01L 2225/06565 (2013.01); H01L 24/45 (2013.01); H01L 2224/48465 (2013.01); H01L 2224/43 (2013.01); H01L 2924/00015 (2013.01); H01L 2224/48247 (2013.01); H01L 2224/85205 (2013.01)

USPC ........... 257/780; 257/781; 257/782; 257/784; 257/E23.02; 257/E23.021; 257/E23.025

(58) Field of Classification Search
USPC ............ 257/780–782, 784, E23.02, E23.021, 257/E23.025
See application file for complete search history.

(56) References Cited

U.S. PATENT DOCUMENTS

| | | | | |
|---|---|---|---|---|
| 6,610,930 | B1* | 8/2003 | Seuntjens | .................... 174/94 R |
| 2009/0020872 | A1* | 1/2009 | Mii et al. | ....................... 257/737 |
| 2010/0213619 | A1 | 8/2010 | Uno et al. | |
| 2010/0327450 | A1 | 12/2010 | Uno et al. | |
| 2011/0104510 | A1 | 5/2011 | Uno et al. | |

FOREIGN PATENT DOCUMENTS

| | | |
|---|---|---|
| JP | 62-97360 A | 5/1987 |
| JP | 2004-6740 A | 1/2004 |
| WO | 2008/087922 A1 | 7/2008 |
| WO | 2009/014168 A1 | 1/2009 |
| WO | 2010/005086 A1 | 1/2010 |

OTHER PUBLICATIONS

International Search Report, dated Oct. 25, 2011, which issued during the prosecution of International Patent Application No. PCT/JP2011/072397, of which the present application is the national phase.

* cited by examiner

*Primary Examiner* — Jasmine Clark
(74) *Attorney, Agent, or Firm* — Troutman Sanders LLP

(57) ABSTRACT

A bonding structure of a ball-bonded portion is obtained by bonding a ball portion formed on a front end of a multilayer copper bonding wire. The multilayer copper bonding wire includes a core member that is mainly composed of copper, and an outer layer that is formed on the core member and is mainly composed of at least one noble metal selected from a group of Pd, Au, Ag and Pt. Further, a first concentrated portion of such noble metal(s) is formed in a ball-root region located at a boundary with the copper bonding wire in a surface region of the ball-bonded portion.

29 Claims, 7 Drawing Sheets

BONDING STRUCTURE OF MULTILAYER COPPER BONDING WIRE

CROSS-REFERENCE TO RELATED APPLICATIONS

This is a U.S. national phase application under 35 U.S.C. §371 of International Patent Application No. PCT/JP2011/072397, filed on Sep. 29, 2011, and claims priority to Japanese Patent Application No. 2010-224213, filed Oct. 1, 2010. The International Application was published on Apr. 5, 2012 as International Publication No. WO 2012/043727 under PCT Article 21(2). The entire contents of these applications are hereby incorporated by reference.

TECHNICAL FIELD

The present invention relates to a bonding structure of a multilayer copper bonding wire.

BACKGROUND ART

As a bonding wire (for performing wire bonding) used to join an electrode on a semiconductor device to an external terminal, there has been mainly used a thin wire (bonding wire) having a wire diameter of about 10-50 µm. A thermocompression bonding technique combined with an ultrasonic wave, is generally employed to perform wire bonding. Meanwhile, there are also used, for example: a general bonding device; and a capillary jig for performing wire bonding by allowing a bonding wire to pass therethrough. Particularly, a front end of a bonding wire is heated and melted through an arc heat input, thus allowing a ball portion to be formed due to a surface tension. The ball portion thus formed is then pressbonded to an electrode of a semiconductor device that has been heated at a temperature of 150-300° C., followed by directly bonding the bonding wire to an external lead side through ultrasonic compression bonding.

In recent years, a rapid diversification has been observed in structures, materials and bonding techniques for semiconductor packaging. As for a packaging structure, for example, other than the current QFP (Quad Flat Packaging) using a lead frame, there have also been put to practical use new packaging structures such as BGA (Ball Grid Array) and CSP (Chip Scale Packaging) that employ a substrate, a polyimide tape or the like. Therefore, there is now required a bonding wire with further improved loop property, bondability, mass productivity and the like.

As a material of a bonding wire, there has been mainly used gold of a high purity of 4N (purity>99.99 mass %). However, since gold is expensive, there is desired a bonding wire that is made of an other kind of metal and whose material cost is inexpensive.

As disclosed, for example, in Patent document 1, there has been developed a bonding wire whose material is copper (referred to as "copper bonding wire" hereunder) such that there can be achieved a superior electrical conductivity, improved ball bondability and wedge bondability or the like with an inexpensive material cost. However, such copper bonding wire has imposed, for example: a problem where a bonding strength decreases due to an oxidation on a wire surface; and a problem where a corrosion or the like easily takes place on the wire surface when encapsulated by resin. These problems are also the reasons why the copper bonding wire has not been actively put to practical use for LSI purposes.

As for a material for a bonding wire to be bonded to, pure Al, an Al alloy or the like has been mainly used in a wiring and an electrode that are formed on a silicon substrate, such wiring and electrode serving as bonding-target portions. As an Al alloy, there is often used an alloy of Al-1% Si, Al-0.5% Cu, Al-1% Si-0.5% Cu or the like. The Al alloy or the like is often used even on a surface of a Cu wiring for micro wiring purposes. Here, a lead frame is plated with Ag, Pd or the like, and a Cu wiring is formed on a resin substrate, a tape or the like. Further, formed on such Cu wiring is a film composed of a noble metal element such as gold and an alloy thereof. That is, it is required that a bondability and bonded-portion reliability resulting from a bonding wire be improved such that the bonding wire can be bonded to the various bonding-target portions.

The copper bonding wire is superior to the conventional gold bonding wire in many aspects. For example, the copper bonding wire can be manufactured with a lower cost and exhibits a superior electrical property. Thus, the copper bonding wire is expected to be a bonding material of the next generation for use in semiconductor packaging and LED packaging. In fact, the copper bonding wire is in a process of being put to practical use in, for example, the latest packaging structures and bonding configurations. As for some of the latest packaging structures, there are only few examples where the gold bonding wire has been used therein. For this reason, the copper bonding wire may also be required to have a mass productivity and reliability of a high level. As for a packaging configuration such as BGA (Ball Grid Array), wire bonding needs to be performed with respect to more than 800 pins if employing a multi-pin graphic LSI. In such case, it is required that there be improved a productivity and yield when performing, for example, staggered bonding, narrow-pitch bonding or high-speed bonding.

There has been put to practical use a multilayer chip structure formed by stacking a plurality of semiconductor chips as one package. Particularly, it is expected that there will be a further increased demand for a composite memory combining a DRAM and a flash memory that are typical semiconductor memories. The multilayer chip structure is often employed for composite memory packaging. And, the requirements of the bonding wire used in the multilayer chip structure have become stricter. Wire bonding performed on a multilayer chip can be divided into: a normal bonding where ball bonding is performed on a chip electrode; and a reverse bonding where wedge bonding is performed through a ball bump formed on the chip electrode. In general, while an advantage of performing normal bonding is that there can be achieved a high productivity, a disadvantage thereof is that the method is not suitable for performing low loop bonding. Meanwhile, while an advantage of performing reverse bonding which was originally put to practical use for multilayer chip purposes is that low loop bonding can be performed relatively easily therewith, a disadvantage thereof is that a decreased productivity is resulted due to the fact that the method includes an additional step for forming the ball bump.

Conventionally, semiconductor chips are fixed to one another in a manner (die bonding) such that entire rear surfaces thereof are actually fixed through an adhesive agent such as a paste. As a new type of multilayer structure in recent days that is suitable for forming a multiyear chip composed of four or more layers of chips, there has been put to use an overhang-type multilayer structure where edge sections of the semiconductor chips are not fixed to one another, but spaces are formed therebelow. As for such overhang-type multilayer structure, since a region beneath an electrode section to which the ball portion is bonded is not fixed, performance requirements for a bonding wire material used therein are strict. Particularly, other than achieving, for example, a stability in a deformed shape of a ball-bonded portion, a shear strength of the bonded portion and a wedge bondability on the ball bump, which have become a problem, it is also required that a super-low loop bondability be achieved when performing thin packaging.

As for a method for joining the multilayer chips, there has been developed a new packaging method substituting a conventional method where the chips are joined to one another with spacers disposed therebetween. An FOW (Film On Wire) method which is a typical example of the aforementioned new packaging method, does not employ spacers, thus expectedly resulting in a low cost. In stead, an FOW resin is used to fix the chips to one another, thus making it possible to secure a chip distance without even employing the spacers. Particularly, the FOW method employs a low-stress and soft resin due to the fact that a periphery of the wire is to be covered thereby. While an FOW method using the gold bonding wire has been put to practical use in the beginning, it is also required that an FOW method using the copper bonding wire be put to practical use in the days to come.

As for a conventional bonding wire having a single-layer structure (referred to as "single layer bonding wire" hereunder), although adding an alloying element(s) is effective in improving, for example, a tensile strength, a strength of the bonded portion and a reliability, there exists a concern that improvements in the properties of the wire may be limited to a certain extent.

In order to meet the diverse needs required for the copper bonding wire, there has been disclosed a copper bonding wire of a multilayer structure (referred to as "multilayer copper bonding wire" hereunder) that is manufactured by coating the wire surface with a metal of an other kind. The multilayer copper bonding wire is expected to increase an added value by further improving the properties thereof as compared to the single layer bonding wire. As a multilayer copper bonding wire having a high function of, for example, preventing an oxidation on a copper surface, Patent document 1 discloses a bonding wire manufactured by coating copper with: a noble metal such as gold, silver, platinum or palladium; or a corrosion-resistant metal such as nickel, cobalt, chrome or titanium. Further, from the perspectives of, for example, ball formability and deterioration prevention of a plating solution, Patent document 2 discloses a bonding wire having a structure composed of: a core member that is mainly composed of copper; a dissimilar metal layer that is formed on the core member and is composed of a metal other than copper; and a coating layer that is formed on the dissimilar metal layer and is composed of an oxidation-resistant metal having a melting point higher than that of copper.

As is the case for the gold bonding wire, the copper bonding wire is also required to satisfy a reliability test of semiconductor. Here, Patent document 3 discloses a bonding structure where a concentrated layer is formed in the vicinity of an interface of a bonded portion between a copper bonding wire and an aluminum electrode, the concentrated layer being a layer in which an electrically-conductive metal other than copper is highly concentrated. Patent document 3 also discloses, for example, that the corresponding bonding structure improves a bonding reliability.

PRIOR ART DOCUMENTS

Patent Documents

Patent document 1: Japanese Unexamined Patent Application Publication No. Sho 62-97360

Patent document 2: Japanese Unexamined Patent Application Publication No. 2004-6740

Patent document 3: International Publication No. WO2008-87922

DISCLOSURE OF THE INVENTION

Problems to be Solved by the Invention

A multilayer copper bonding wire can, for example, allow a surface oxidation to be controlled, thus resulting in a workability that is more favorable than that of the conventional copper bonding wire. For this reason, the multilayer copper bonding wire has already been put to practical use to an extent in performing bonding on a general single layer chip. In order to promote the multilayer copper bonding wire in the days to come, it is required that the multilayer copper bonding wire be applied in a field of multilayer-chip bonding for the purpose of, for example, manufacturing the aforementioned composite memory, the field of multilayer-chip bonding being a field that is expected to show a significant market growth hereafter. That is, desired is a multilayer copper bonding wire capable of, for example, overcoming technical problems unique to multilayer-chip bonding or meeting strict performance requirements also unique to multilayer-chip bonding. Particularly, it is critical, for example, to achieve the super-low loop bondability when performing thin packaging, stabilize a compression-pressed shape when performing ball bonding and improve the bonding strength.

While reverse bonding is advantageous to achieving a low loop bondability, there exists a concern that a productivity may decrease and an equipment investment may have to be made, for example, due to the fact that an additional step is required for forming a bump and wedge bonding is performed on the corresponding bump. Here, a strong expectation has been built in practically performing super-low loop bonding on a multilayer chip through normal bonding that does not require bump formation but ensures a high productivity. In order to perform normal bonding at a mass production level on a future multilayer chip composed of four or more layers of chips, it is required that the multilayer copper bonding wire be used to perform super-low loop bonding at a loop height of not higher than 55 µm.

Following are the problems that need to be solved when forming super low loops with the multilayer copper bonding wire. That is, there needs to be satisfied all together, for example: a property of stabilizing a target height of the low loops by reducing a variation in the heights of the loops; a property of causing no damage such as cracks to a neck portion (referred as "neck cracks" hereunder) corresponding to a section of the wire that is located in the vicinity of the ball portion; and a property of not causing the neck portion to lean (referred to as "neck leaning" hereunder).

Difficulties in performing low loop bonding can be categorized into, for example, (1) difficulty in performing super-low loop bonding at the loop height of not higher than 55 µm, (2) usage of a multilayer copper bonding wire whose wire surface differs from a core member thereof in, for example, material, structure and hardness, and (3) difficulty in performing multilayer chip bonding at various loop heights. Here, the stabilization of the loop height is also required and the neck cracks also occur, when using the conventional single layer gold bonding wire. Meanwhile, it is extremely difficult to realize low loop bonding at a mass production level if using the conventional multilayer copper bonding wire to perform multilayer chip bonding.

Other problems include an improvement in the ball bondability. Specifically, when performing multilayer chip bonding, there exists a problem where a ball bonding strength decreases due to, for example, a low bonding temperature or an insufficient chip fixation that occurs at times. Particularly, chip fixation is insufficient in the overhang-type multilayer structure where a space is formed below each semiconductor chip on which the ball-bonded portion is formed, or a multilayer structure of the FOW method where the FOW resin is used to fix each semiconductor chip underneath the ball-bonded portion formed thereon. For this reason, a transmission level of a load and ultrasonic vibration decreases, thus causing the bonding strength to decrease also. Further, a problem common to various types of multilayer chip structures is that since a bonding device is only heated by a heating stage from below, temperatures of upper layer semiconductor chips decrease, thus making it difficult to improve the bonding strength. A concern with the conventional multilayer copper bonding wire is that an outer layer and core member thereof are alloyed as result of being melted and mixed with each other at the time of forming the ball portion, thus causing the ball-bonded portion to deform or resulting in, for example, an unstable bonding strength.

As mentioned above, in order to promote the practical use of the multilayer copper bonding wire in the days to come, it is required that improvements be made in a bonding structure such that the multilayer copper bonding wire can be suitably used to perform multilayer chip bonding when manufacturing, for example, the composite memory and the flash memory. Thus, it is an object of the present invention to provide a bonding structure formed with a multilayer copper bonding wire and the corresponding multilayer copper bonding wire. Specifically, the bonding structure of the present invention can ensure a superior industrial productivity, and is capable of realizing low loop bonding and improving the ball bondability by solving the aforementioned problems imposed by the conventional techniques as far as the practical use of the multilayer copper bonding wire is concerned.

Means to Solve the Problems

The invention according to a first aspect of the present invention is a bonding structure of a ball-bonded portion obtained by bonding to a bonding-target portion a ball portion formed on a front end of a multilayer copper bonding wire, in which the multilayer copper bonding wire includes: a core member mainly composed of copper; and an outer layer formed on the core member and mainly composed of at least one noble metal selected from the group of Pd, Au, Ag and Pt, in which the bonding structure includes a first concentrated portion in which the at least one noble metal is highly concentrated, the first concentrated portion being formed in a ball-root region, the ball-root region being in such a surface region of the ball-bonded portion as is located at a boundary with the multilayer copper bonding wire.

According to the invention of a second aspect of the present invention, a total concentration of the at least one noble metal in the first concentrated portion is not lower than 0.05 mol % and not higher than 6 mol %.

According to the invention of a third aspect of the present invention, a thickness of the first concentrated portion formed in the ball-root region is not less than 1% and not more than 50% of a wire diameter, when observed on a cross section of the ball-bonded portion taken along a plane orthogonal to a bonded interface between the ball-bonded portion and the bonding-target portion.

According to the invention of a fourth aspect of the present invention, a total area of the first concentrated portion formed in the ball-root region occupies not less than 2% and not more than 30% of a cross-sectional area of the ball-bonded portion, when observed on the cross section of the ball-bonded portion taken along the plane orthogonal to the bonded interface between the ball-bonded portion and the bonding-target portion.

The invention according to a fifth aspect of the present invention, further includes a second concentrated portion in which the at least one noble metal is highly concentrated, the second concentrated portion being formed in at least one location inside the ball-bonded portion when observed on the cross section of the ball-bonded portion taken along the plane orthogonal to the bonded interface between the ball-bonded portion and the bonding-target portion.

The invention according to a sixth aspect of the present invention, further includes a third concentrated portion in which the at least one noble metal is highly concentrated, the third concentrated portion being formed in the bonded interface between the ball-bonded portion and the bonding-target portion.

According to the invention of a seventh aspect of the present invention, only the first concentrated portion exists in the surface region of the ball-bonded portion, when observed on the cross section of the ball-bonded portion taken along the plane orthogonal to the bonded interface between the ball-bonded portion and the bonding-target portion.

According to the invention of an eighth aspect of the present invention, the at least one noble metal includes two or more kinds of noble metals in total that are Pd and at least one of Au and Ag, and a ratio of a total concentration of Au and Ag to a Pd concentration is not lower than 0.01 and not higher than 0.4.

According to the invention of a ninth aspect of the present invention, a total area of the first concentrated portion and the second concentrated portion occupies not less than 5% and not more than 70% of the cross-sectional area of the ball-bonded portion, when observed on the cross section of the ball-bonded portion taken along the plane orthogonal to the bonded interface.

According to the invention of a tenth aspect of the present invention, the outer layer of the multilayer copper bonding wire is formed to a thickness of not smaller than 0.01 μm and not larger than 0.4 μm.

According to the invention of an eleventh aspect of the present invention, a diffusion layer having a concentration gradient of copper and the at least one noble metal is formed between the outer layer and core member of the multilayer copper bonding wire, the diffusion layer being formed to a thickness of not smaller than 0.003 μm and not larger than 0.15 μm.

According to the invention of a twelfth aspect of the present invention, the outer layer of the multilayer copper bonding wire is mainly composed of Pd, and a concentrated layer of at least one of Au and Ag is formed in an interface between the outer layer and the core member.

According to the invention of a thirteenth aspect of the present invention, the outer layer of the multilayer copper bonding wire is mainly composed of Pd, and a concentrated layer of at least one of Au and Ag is formed on a surface of the outer layer.

Effects of the Present Invention

The bonding structure of the ball-bonded portion formed with the multilayer copper bonding wire of the present inven-

MODE FOR CARRYING OUT THE INVENTION

The inventors of the present invention confirmed that a performance of a copper bonding wire for multilayer-chip bonding could be improved by forming a highly-concentrated portion of at least one noble metal selected from a group of Pd, Au, Ag and Pt in a ball-root region located at a boundary between the copper bonding wire and a ball-bonded portion. Improvements in the aforementioned performance can be effectively made by appropriately adjusting, for example, a distribution, thickness and concentration of the concentrated portion and employing, for example, an appropriate noble metal(s). Further, improvements in a bonding workability, for example, can also be effectively made by adjusting the distribution, a relative concentration ratio or the like of the concentrated portion in an unbonded ball portion. Furthermore, an overall property suitable for various types of packaging can be improved by appropriately adjusting, for example, a structure, thickness and concentration of an outer layer of a multilayer copper bonding wire. Preferable modes of the present invention are described in detail hereunder.

Figure 1:
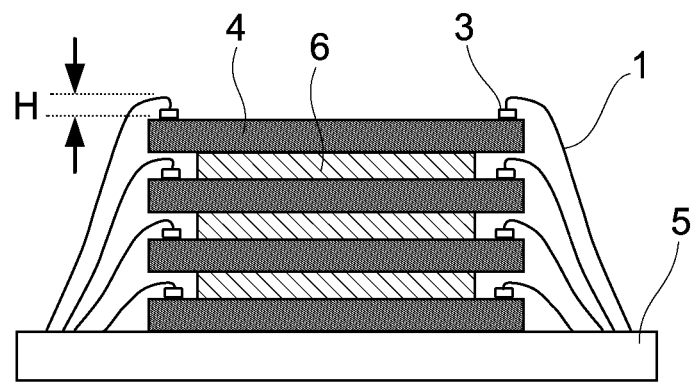
FIG. 1 is a diagram showing a structure of an overhang-type multilayer chip of a working example of the present invention.

FIG. 1 is a diagram of an overhang-type multilayer structure. That is, the diagram shows an example of a bonding structure of a multilayer chip. A packaging procedure of the overhang-type multilayer structure includes: (1) a step of joining an electrode film 8 of a bottom-layer semiconductor chip 4 to a substrate 5 with a multilayer copper bonding wire 1; (2) a step of mounting a second-layer semiconductor chip 4 thereon through a spacer 6; and (3) a step of joining the electrode film 8 of the second-layer chip to the substrate 5 with the multilayer copper bonding wire 1. Likewise, semiconductor chips including a third-layer chip and chips thereabove are stacked by repeating (2) semiconductor chip mounting and (3) wire bonding. Here, a tape-shaped adhesion member is often used to adhere the spacer and the semiconductor chip to each other. A packaged multilayer chip can be effectively made thinner as a whole, by performing low loop bonding with a low height H (referred to as "loop height" hereunder) from a surface of each semiconductor chip to a loop of the multilayer copper bonding wire 1.

As for a bonding structure of a ball-bonded portion that is formed by bonding to a bonding-target portion a ball portion formed on a front end of a multilayer copper bonding wire, it is desired that the multilayer copper bonding wire include: a core member that is mainly composed of copper; and an outer layer that is formed on the core member and is mainly composed of at least one noble metal selected from a group of Pd, Au, Ag and Pt, and that a highly-concentrated portion of the aforementioned noble metal(s) be formed in a ball-root region of a surface region of the ball-bonded portion, the ball-root region being located at a boundary with the multilayer copper bonding wire. The aforementioned bonding structure allows both a super-low loop bondability and a ball bondability to be improved when performing multilayer-chip bonding. Particularly, the concentrated portion refers to a region where a concentration of the noble metal(s) is relatively higher than that of an unconcentrated region inside the ball-bonded portion, and where a concentration ratio of the former to the latter is 1.5 or larger. A main component refers to a metal element (copper in this case) whose concentration occupies not less than 50% of a total concentration of metal elements contained in the entire multilayer copper bonding wire. The ball-root region is a section of the ball-bonded portion that is located at the boundary between the multilayer copper bonding wire and the corresponding ball-bonded portion. Further, a multilayer chip refers to that composed of not less than two layers of semiconductor chips that are stacked on top of another. Super-low loop bonding refers to a type of normal bonding where a loop height H of the loops formed is not higher than 55 μm. The ball bondability collectively refers to: a bonding strength property for bonding the ball portion to the electrode film serving as the bonding-target portion; and a shape property of the ball portion.

Figure 2:
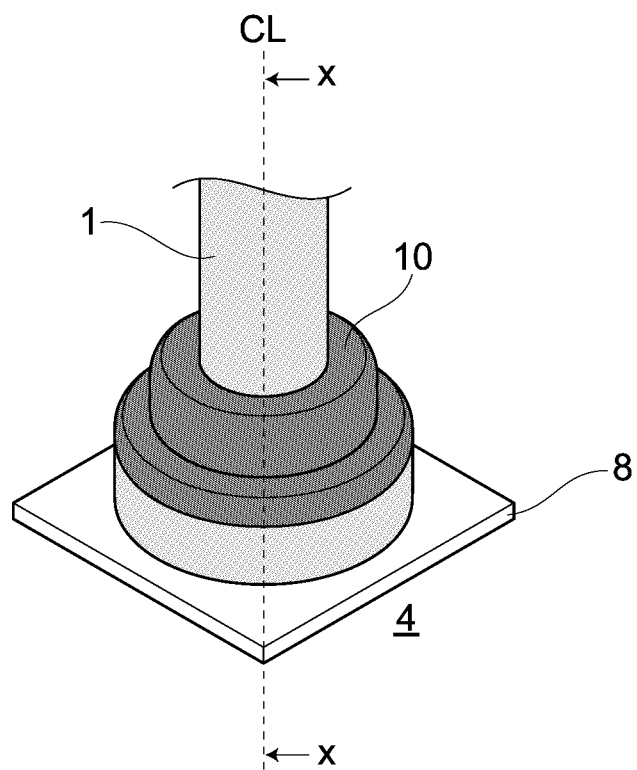
FIG. 2 is a perspective view showing a ball-bonded portion in the working example of the present invention.

FIG. 2 is a perspective view of the ball-bonded portion of the present example. The ball portion is to be formed on the front end of the multilayer copper bonding wire through arc discharge. The ball portion thus formed is then bonded to the electrode film 8 on the semiconductor chip 4, while being subjected to a load and an ultrasonic vibration. Here, a first concentrated portion 10 of at least one noble metal selected from the group of Pd, Au, Ag and Pt, is formed in a ball-root region 9 of the surface region of the ball-bonded portion, the ball-root region 9 being particularly located at the boundary with the multilayer copper bonding wire 1. Such ball-root region 9 is also referred to as a neck portion.

Figure 3:
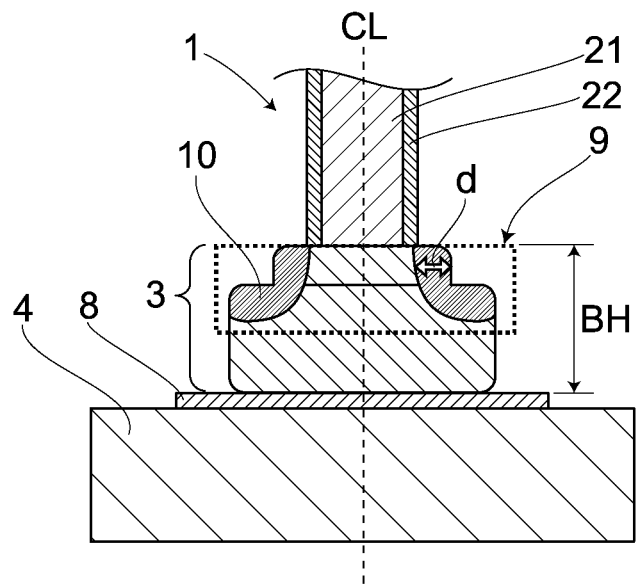
FIG. 3 is a cross-sectional view that is taken on an X-X direction in FIG. 2 and shows a concentrated portion located in a ball terminal section in the working example of the present invention.

The first concentrated portion 10 is formed on an entire circumference of the neck portion. FIG. 3 is a cross-sectional view of the ball-bonded portion that is taken on an x-x direction in FIG. 2. The multilayer copper bonding wire 1 includes: a core member 21 whose main component is copper; and an outer layer 22 that is formed on the core member 21 and whose main component is at least one noble metal selected from the group of Pd, Au, Ag and Pt. The first concentrated portion 10 of a thickness d is formed in the ball-root region 9 of the ball-bonded portion in a manner such that the first concentrated portion 10 actually ranges from a ball surface to an inner section thereof. A preferable range of the thickness d of the first concentrated portion 10, is described later. Here, it is desired that the first concentrated portion 10 exhibit substantially similar cross-sectional structures in any cross section. Further, with reference to a cross section of the ball-bonded portion, the ball-root region 9 corresponds to a region that is closer to the multilayer copper bonding wire 1 from half (½) the height of a ball-bonded portion height BH. The aforementioned cross section refers to a cross section that is orthogonal to a bonded interface and includes a center axis of the wire.

A first effect of the first concentrated portion 10 is as follows. That is, when forming different types of loops on each layer of chip of a multilayer structure, there can be satisfied the conflicting properties of stabilizing the loop height and controlling neck cracks at the time of performing super-low loop bonding. For example, described hereunder are formations of different types of loops that are so different from one another that chip-distances from a resin substrate to which the multilayer copper bonding wire has been wedge-bonded to the surfaces of the semiconductor chips are 200 μm, 350 μm, 500 μm and such. Specifically, with respect to any of the aforementioned chip-distances, a height variation at the time of performing super-low loop bonding can be controlled while controlling an occurrence of neck cracks, thus making it possible to realize super-low loop bonding at a loop height of not higher than 55 μm. Such effect is also related to specificities of the neck portion formed with the multilayer copper bonding wire. Particularly, recrystallization progresses in the neck portion due to a heat applied at the time of forming the ball portion. Here, as for a multilayer copper bonding wire whose outer layer and core member exhibit different hardnesses and structures, a neck portion formed therewith where recrystallization has progressed exhibits ununiformity such as elongation and processing strain more noticeably than a wire main body, thus imposing a problem of causing neck cracks to occur more frequently than a conventional single layer bonding wire. In contrast, as for the multilayer copper bonding wire of the present example, the first concentrated portion 10 is to be formed in the ball-root region, thus making it possible to effectively control neck cracks when forming super-low loops with the corresponding multilayer copper bonding wire.

A second effect of the first concentrated portion 10 is that a ball bonding strength in a multilayer chip can be improved. Other advantages include the fact that a load and ultrasonic vibration can be kept as low as possible to acquire the bonding strength. That is, the load and ultrasonic vibration can be kept low due to the fact that the first concentrated portion 10 is to be formed. Therefore, when performing ball bonding on the overhang-type multilayer structure, the ball bonding strength can be improved without causing semiconductor chips to be subjected to damages such as breakages and cracks.

While the formation of the first concentrated portion 10 fosters improvements in, for example, the super-low loop bondability and the ball bonding strength in a multilayer chip, a mechanism thereof is as follows. That is, it is assumed that such fostering is effectively related to, for example, controlling propagation of neck cracks and improving a grip property of the ball portion inserted in a capillary. Therefore, even if a load applied to the neck portion increases as a result of performing super-low loop bonding, the occurrence of neck cracks can still be controlled, thus allowing a low loop height to be maintained. Further, even if a load applied to the ball-bonded portion increases as a result of performing super-low loop bonding, the ball bonding strength can still be improved, thus making it possible to realize super-low loop bonding. Propagation of neck cracks is fostered when a surface outer layer and copper ball portion of a multilayer copper bonding wire exhibit significantly different strengths, ductilities and structures. In contrast, the first concentrated portion 10 includes the aforementioned noble metal(s) that are contained in copper, and plays an intermediate role between the outer layer and the copper ball portion in terms of strength, ductility and structure, and thus, progress of neck cracks is expected to be controlled. Further, the first concentrated portion 10 improves the grip property and an adhesion of the ball portion to a capillary inner wall, thereby allowing the ball portion to be held stably when performing ball bonding on a multilayer chip where chip fixation tends to be unstable, thus supposedly improving transmission efficiencies of, for example, the load and ultrasonic vibration.

In the cross section of the ball-bonded portion that is orthogonal to the bonded interface between the ball-bonded portion and the electrode film, it is desired that a total area of the first concentrated portion 10 occupy not less than 2% and not more than 30% of a cross-sectional area of the ball-bonded portion. The rate of not less than 2% and not more than 30% is effective in controlling a phenomenon where leaning (referred to as "root leaning" hereunder) occurs from wire roots that are located in the vicinity of the boundaries with the ball-bonded portions. Therefore, a range of conditions of a device for forming super-low loops can be expanded, thus making it possible to improve productivity. The aforementioned root leaning is a defect that is uniquely observed when performing super-low loop bonding with a multilayer copper bonding wire. Specifically, root leaning is a phenomenon where a local portion of a wire root deforms toward a second bonding direction, and is noticeable when employing a thin wire whose wire diameter is not larger than 20 μm. The first concentrated portion 10 improves a stability of the wire root, thus further improving an effect of controlling wire leaning even when an external force is being applied to the multilayer copper bonding wire. Following are the reasons for the first concentrated portion 10 to occupy not less than 2% and not more than 30% of the cross-sectional area of the ball-bonded portion. That is, the aforementioned effect can only be achieved at a low level, if the rate is less than 2%. Meanwhile, a rate of greater than 30% causes the ball portion to undergo an irregular deformation more frequently, thus making it difficult for a shape of a true circle to be maintained. Preferably, a range of not less than 4% and not more than 25% allows there to be achieved a high effect of controlling root leaning even under a stricter condition where an extra-fine wire having a wire diameter of not larger than 18 μm is used.

As for packaging structures other than a multilayer chip structure, the formation of the aforementioned first concentrated portion 10 equally allows super-low loop bonding to be performed at a mass production level as a result of controlling neck cracks and root leaning. For example, the first concentrated portion 10 was confirmed to be effective in performing super-low loop bonding on a single layer chip structure such as QFP (Quad Flat Package), BGA (Ball Grid Array) and QFN (Quad Flat Non-lead). Further, there was also confirmed a case where the aforementioned effect was higher in a single layer chip structure than in a multilayer chip structure. For example, the formation of the first concentrated portion 10 was effective in stabilizing a low loop bondability at a long span (wire length) of not smaller than 3.5 mm. This is related to the following facts. That is, when employing a long span in a single layer chip structure, a low chip-distance is resulted, thereby causing a loop shape to exhibit a strong tendency of bending upward, thus also causing neck cracks to occur more frequently if forcedly performing low loop bonding. Even in such case, both neck cracks and root leaning can be controlled if the first concentrated portion 10 occupies not less than 4% and not more than 25% of the cross-sectional area of the ball-bonded portion. For example, even with regard to a single layer chip structure employing: a wire diameter of 18 μm; a span of 4 mm; a chip-distance of 150 μm; and a loop height of 55 μm, both neck cracks and root leaning were confirmed, through experiments, to have been controlled, when the first concentrated portion 10 had been formed at the rate of not less than 4% and not more than 25%.

The first concentrated portion 10 is a region where the concentration of the noble metal(s) is relatively higher than that of the unconcentrated region inside the ball-bonded portion. Here, it is desired that a total concentration of the noble metal(s) be within a range of not lower than 0.05 mol % and not higher than 6 mol %. When the concentration of the first concentrated portion 10 is not lower than 0.05 mol % and not higher than 6 mol %, the aforementioned grip property improves, thus improving the ball bonding strength in the overhang-type multilayer structure. Here, following are the reasons for the total concentration of the noble metal(s) to be not lower than 0.05 mol % and not higher than 6 mol %. That is, when the concentration is lower than 0.05 mol %, an effect of improving both the low loop bondability and the ball bonding strength is small. In contrast, when the concentration is greater than 6 mol %, the ball portion hardens such that chip damages may occur. Preferably, when the concentration is not lower than 0.2 mol % and not higher than 4 mol %, a shear strength in the overhang-type multilayer structure can still be increased even at a low temperature of 150° C. or lower. More preferably, when the concentration is not lower than 0.5 mol % and not higher than 3 mol %, the effect of increasing the shear strength at the low temperature of 150° C. or lower can be further improved.

Other than the first concentrated portion 10 in the ball-root region, it is desired that a surface in which the noble metal(s) are not concentrated (referred to as "unconcentrated surface" hereunder) also be formed on a side surface of the ball-bonded portion, the side surface being a section aside from the ball-root region. The unconcentrated surface is composed of either a pure copper or copper alloy having a composition equivalent to that inside the ball portion. When both the unconcentrated surface and the first concentrated portion 10 serving as a concentrated portion of the ball-root region exist, there can be achieved high effects of increasing the ball bonding strength at a low temperature and reducing a defect such as aluminum splash. Here, while a main function of the first concentrated portion 10 is to improve the grip property of the ball portion inside the capillary, a main function of the unconcentrated surface is to promote a compressive deformation of the ball portion and an interdiffusion between Cu and Al in the bonded interface. It is effective in reducing the aluminum splash defect, when an area of the unconcentrated surface occupies not less than 10% and not more than 70% of an area of a surface of the ball-bonded portion.

Upper-layer semiconductor chips in a multilayer chip are subjected to a temperature lower than that of a heating stage. Therefore, improvements in productivity can be made favorably, if it is possible to increase the ball bonding strength at a low temperature. Aluminum splash refers to a phenomenon where a part of a soft aluminum electrode film discharges to an outer circumference of the ball-bonded portion due to ball deformation and the load and ultrasonic vibration at the time of bonding the copper ball portion to the aluminum electrode film. Particularly, a defect such as an electrical short occurs when the aluminum electrode film thus discharged comes into contact with an adjacent pad or ball-bonded portion. As a result of controlling the aluminum splash defect which has frequently become a problem in performing copper ball bonding, an appropriate range of bonding conditions can be expanded, thus contributing to improvements in a packaging yield. That is, as a result of forming both the first concentrated portion 10 and the unconcentrated surface, not only the ball bonding strength can be increased, but improvements can also be made in reducing the aluminum splash defect, thus significantly contributing to improvements in the productivity and yield of a multilayer chip.

Figure 4:
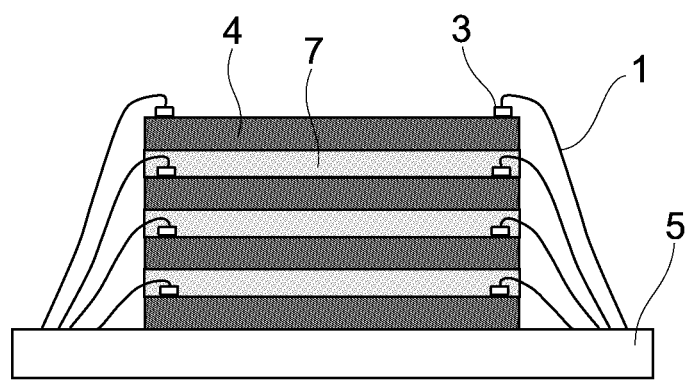
FIG. 4 is a diagram showing a structure of an FOW-type multilayer chip of the working example of the present invention.

In the cross section of the ball-bonded portion that is orthogonal to the bonded interface between the ball-bonded portion and the electrode film, it is desired that the thickness d of the first concentrated portion 10 formed in the ball-root region be not less than 1% and not more than 50% of a wire diameter. This brings about an effect of making a ball-bonded shape closer to that of a true circle in a new FOW-type multilayer chip structure. FIG. 4 is a diagram of an FOW-type multilayer structure. That is, the diagram shows an example of a bonding structure of a multilayer chip. An FOW-type packaging described hereunder does not employ spacers, but uses a FOW resin 7 to join and fix the chips to one another, thus contributing to cost reduction and process simplification. A procedure thereof successively includes: joining the electrode film 8 on the semiconductor chip 4 to the substrate 5 with the multilayer copper bonding wire 1; mounting the FOW resin 7 on such semiconductor chip 4; mounting an upper-layer semiconductor chip 4 on such FOW resin 7; fixing and adhering the corresponding upper-layer semiconductor chip 4 thereto while performing heating. Although gold bonding wires have been progressively used to perform practical FOW packaging, copper bonding wires are now expected more than ever to be used in FOW packaging. According to a conventional technique, the FOW resin with a low elasticity used to move at the time of performing ball bonding, thereby imposing a problem of resulting in an unstable ball-bonded shape such as an oval shape.

Following are the reasons for the thickness d of the first concentrated portion 10 to be not less than 1% and not more than 50% of the wire diameter. That is, when such rate is not less than 1%, there can be achieved the effect of making the ball-bonded shape closer to that of a true circle by improving the grip property of the ball portion, even when employing the unstable FOW resin. Meanwhile, a rate of greater than 50% reduces a volume of the ball portion that is to be inserted into the capillary, thereby degenerating the grip property, thus causing the ball portion to undergo a petal deformation more frequently. While such improvement effect brought about by the thickness of the first concentrated portion 10 is noticeable in an FOW-type multilayer chip, a similar effect was also confirmed in, for example, a normal multilayer chip and a single layer chip employing narrow-pitch bonding. Here, adjusting the thickness of the first concentrated portion 10 through a rate to the wire diameter, is effective in easily making comprehensive improvements in various packaged products that employ different wire diameters, ball diameters and the like. Preferably, when such rate is not less than 3% and not more than 45%, there can be achieved a high effect of stabilizing the ball-bonded shapes on a third-layer chip of the FOW-type multilayer chip.

In general, since semiconductor chips have become larger, a deformation volume of the FOW resin has increased as well due to the load and ultrasonic vibration, thus raising a concern that the ball-bonded shape may become unstable. However, when the aforementioned rate is not less than 5% and not more than 35%, there can be achieved the high effect of making the ball-bonded shape closer to that of a true circle even in a large chip.

Figure 5:
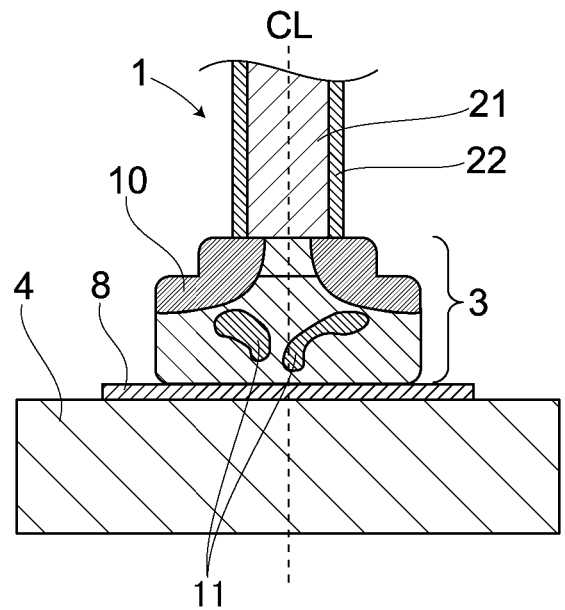
FIG. 5 is a cross-sectional view that is taken on the X-X direction in FIG. 2 and shows: the concentrated portion located in the ball terminal section; and a concentrated portion inside a ball portion, in the working example of the present invention.

As for the bonding structure, other than the first concentrated portion 10 formed in the ball-root region, it is also desired that a concentrated portion be formed in at least one location inside the ball-bonded portion. Here, a concentrated portion inside the ball-bonded portion is referred to as a second concentrated portion 11. The formation of the second concentrated portion 11 improves an effect of preventing a center-unbonded defect (referred to as "center defectiveness" hereunder), the center-unbonded defect being a defect where an insufficient metal joining or an insufficient growth of intermetallic compound occurs in a center of the ball-bonded interface. FIG. 5 shows an example of how the second concentrated portion 11 is formed inside a ball-bonded portion 3. The second concentrated portion 11 may be formed in any cross section orthogonal to the bonded interface, and may or may not be formed into a shape identical to that of an other second concentrated portion(s) 11. Further, the shapes and number of the second concentrated portions 11 are not limited to those shown in FIG. 5. Since the formation of the second concentrated portion 11 controls the center defectiveness, a high improvement effect can be achieved in a multilayer chip. Preferably, a further noticeable improvement effect is expected in the overhang-type multilayer structure or the FOW-type multilayer structure. Advantages of controlling the center defectiveness are as follows. That is, not only an initial bonding defect such as peeling can be controlled in a bonding process, but a long-term reliability, when subjected to a high-temperature heating, a high-temperature/high-humidity heating or the like, can also be improved. It is assumed that the second concentrated portion 11 serves to either moderately improve a deformation resistance of the ball portion at the time of grounding or an initial deformation, or disperse a transmission of the load and ultrasonic vibration inside the ball portion, thereby promoting metal joining and a growth of intermetallic compound in the center of the ball-bonded interface. In the second concentrated portion 11, it is desired that a total concentration of the aforementioned noble metal(s) be in a range of not lower than 0.05 mol % and not higher than 5 mol %. When such concentration is lower than 0.05 mol %, the effect of controlling the center defectiveness in a multilayer chip is small. Meanwhile, a concentration of higher than 5 mol % raises a concern that chip damages may occur due to hardening of the ball portion. Further, it is desired that a total area of the second concentrated portion 11 occupy not less than 3% and not more than 50% of the cross-sectional area of the ball-bonded portion. When this rate is less than 3%, the improvement effect is small. Meanwhile, a rate of greater than 50% increases the deformation resistance of the ball portion, thereby imposing a problem of incurring chip damages at the time of performing bonding.

The aforementioned first concentrated portion 10, the second concentrated portion 11 and the unconcentrated region can be easily identified based on, for example, colors and concentrations thereof. The concentrated portions and the unconcentrated region can be identified through, for example: a color identification performed on the cross section of the ball-bonded portion by an optical microscope; or mapping performed through an area analysis on the cross section of the ball-bonded portion by EPMA (Electron Probe Micro Analyzer), EDX (Energy Dispersive X-ray spectrometry) or the like. Here, the aforementioned areas of the concentrated portions may also be easily obtained through the color identification by the optical microscope.

In the cross section of the ball-bonded portion that is orthogonal to the bonded interface between the ball-bonded portion and the electrode film, it is desired that a total area of the first concentrated portion 10 and the second concentrated portion 11 occupy not less than 5% and not more than 70% of the cross-sectional area of the ball-bonded portion. When the total area of the first concentrated portion 10 and the second concentrated portion 11 are formed at such rate, not only improvements are made in the super-low loop bondability and the ball bondability at the time of performing multilayer-chip bonding, but a pressed-ball height of a small-ball-bonded portion may also be advantageously stabilized. Here, a small ball refers to a condition where a diameter of an initial ball portion is 1.2-1.7 times larger than the wire diameter. The stabilization of the pressed-ball height constitutes an effective control index for reducing variations in, for example, the bonding strength and a bonding size. Following are the reasons for the total area of the first concentrated portion 10 and the second concentrated portion 11 to occupy not less than 5% and not more than 70% of the cross-sectional area of the ball-bonded portion. That is, when such rate is less than 5%, the improvement effect is small. Meanwhile, a rate of greater than 70% imposes a problem of incurring chip damages at the time of performing bonding. Preferably, a range of not less than 10% and not more than 65% is effective in similarly stabilizing the pressed-ball height even in a single layer chip structure such as BGA and CSP. More preferably, a range of not less than 15% and not more than 60% allows the pressed-ball height in the FOW-type multilayer chip structure to be stabilized in a further improved manner.

Figure 6:
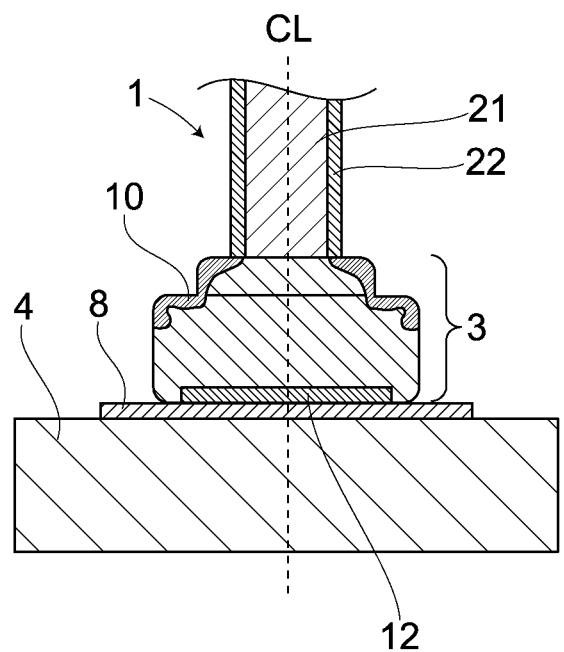
FIG. 6 is a cross-sectional view that is taken on the X-X direction in FIG. 2 and shows: the concentrated portion located in the ball terminal section; and a concentrated portion formed in a bonded interface, in the working example of the present invention.

As a bonding structure, other than the first concentrated portion 10 formed in the ball-root region, it is desired that a concentrated portion also be formed in the bonded interface between the ball-bonded portion and the electrode film. The concentrated portion formed in the bonded interface between the ball-bonded portion and the electrode film, is referred as a third concentrated portion 12. FIG. 6 shows an example of how the third concentrated portion 12 is formed in the bonded interface between the ball-bonded portion 3 and the electrode film 8. Here, it is desired that the third concentrated portion 12 be formed in the entire bonded interface. The formation of the third concentrated portion 12 allows there to be achieved an effect of improving a long-term reliability of the ball-bonded portion. Particularly, there can be improved a bonding reliability observed in an accelerated test such as a high-temperature heating test at 170° C., or a high-humidity heating test including a PCT test (Pressure Cooker Test) and an HAST test (Highly Accelerated Temperature and Humidity Stress Test). The effect of improving the bonding reliability is higher if allowing the third concentrated portion 12 and the first concentrated portion 10 to be formed at the same time, rather than allowing the third concentrated portion 12 to be formed separately from the first concentrated portion 10. That is, the formation of the first concentrated portion 10 makes diffusion in an initial bonded interface relatively easy, thereby presumably promoting a uniform growth of intermetallic compound.

It is desired that a thickness of the third concentrated portion 12 be not smaller than 0.03 µm and not larger than 6 µm. Particularly, when this thickness is not smaller than 0.03 µm, there can be achieved a high effect of improving the bonding reliability observed in the aforementioned high-temperature heating at 170° C. Meanwhile, a thickness of greater than 6 µm raises a concern that damages such as microcracks may occur under the electrode when performing ball bonding on a multilayer chip. Preferably, when the thickness of the third concentrated portion 12 is not smaller than 0.2 µm and not larger than 4 µm, there can be further prolonged a life of a ball-bonded portion subjected to a high-humidity heating of 130° C.-85% RH (relative humidity). Further, in the third concentrated portion 12, it is desired that a highest total concentration of the noble metal(s) be not lower than 0.1 mol % and not higher than 6 mol %. The reasons for that are as follows. That is, when the highest total concentration is less than 0.1 mol %, the improvement effect in the bonding reliability is small. Meanwhile, a highest total concentration of greater than 6 mol % imposes a problem of incurring chip damages in the overhang-type multilayer structure due to a landing impact of the ball portion.

Here, it may also be advantageous to allow only the first concentrated portion 10 to exist in the surface region of the ball-bonded portion. That is, there can be achieved an effect of controlling a lift-off defect in a multilayer chip, when only the first concentrated portion 10 is formed as a concentrated portion in the surface region of the ball-bonded portion. Here, the lift-off defect refers to a defective phenomenon where peeling occurs in the bonded interface between the ball-bonded portion and the electrode film when performing continuous bonding on a mass production line. The occurrence of the lift-off defect on a mass production line has been considered as a problem regardless of how high an average bonding strength may be. Especially, in the overhang-type multilayer structure or the FOW-type multilayer structure, it is effective to form only the first concentrated portion 10 as a concentrated portion in the surface region of the ball-bonded portion. As for such multilayer structures, since the semiconductor chips thereof are not sufficiently fixed, the load and ultrasonic vibration are often set to a lower level, whereas a load and scrub operation (low-frequency vibration) are often set to a slightly higher level. Such bonding conditions are selected in a different manner than the bonding conditions of a normal single layer chip. Under the aforementioned bonding conditions, if an oxide film and/or a contamination layer on an electrode surface are thick, it is difficult to achieve an adhesion in the bonded interface in a short time of several tens of milliseconds for performing continuous bonding. In contrast, by forming only the first concentrated portion 10 as a concentrated portion in the surface region of the ball-bonded portion, destructions of the oxide film and/or the contamination layer are, for example, promoted, thereby resulting in a uniform adhesion in the bonded interface between the ball-bonded portion and the electrode film, thus making it possible to control the lift-off defect. The reasons for that are as follows. That is, since the third concentrated portion 12 is now absent on the ball surface coming into contact with the electrode film, i.e., copper is now exposed on the ball surface, the oxide film and/or the contamination layer can be destroyed, thus not only resulting in a favorable metal joining, but also promoting the interdiffusion between copper and an electrode component.

It is desired that at least one noble metal selected from the group of Pd, Au, Ag and Pt be concentrated in a concentrated portion. That is, there can be relatively easily formed the first concentrated portion 10 mainly composed of copper and at least one noble metal selected from the group of Pd, Au, Ag and Pt. Moreover, there can be achieved high effects of, for example, realizing super-low loop bonding and improving the ball bonding strength in a multilayer chip. Here, there exists a wide range of the bonding conditions for forming the second concentrated portion 11 and the third concentrated portion 12, and it was confirmed that high effects could also be achieved in controlling the center defectiveness and improving the bonding reliability which are respectively the function effects of the second concentrated portion 11 and the third concentrated portion 12. Further, it was confirmed that a concentrated portion formed with the unique noble metal group of Pd, Au, Ag and Pt was effective in stably realizing the aforementioned improvement effects. Preferably, when employing at least one noble metal selected from a group of Pd, Au and Ag, there can be achieved a noticeable effect of controlling the occurrence of the root leaning defect at the time of performing super-low loop bonding. More preferably, when mainly employing Pd, there can be achieved a higher effect of further making the shape of the ball-bonded portion having the first concentrated portion 10 closer to that of a true circle.

Other than the first concentrated portion 10 formed in the ball-root region, when a thickness of the outer layer of the multilayer copper bonding wire is not smaller than 0.01 µm and not larger than 0.4 µm, there can be effectively increased a first pull strength measured by breaking the wire at the neck portion. As described later, the first pull strength refers to a breaking strength measured by hooking and then breaking a section of the wire that is in the vicinity of the ball-bonded portion. That is, it is desired that the multilayer copper bonding wire include: the core member that is mainly composed of copper; and the outer layer that is formed on the core member and is mainly composed of at least one noble metal selected from the group of Pd, Au, Ag and Pt, and that the corresponding outer layer have the thickness of not smaller than 0.01 µm and not larger than 0.4 µm. A problem with the neck portion is that a strength thereof may be lower than that of the wire main body due to the progression of recrystallization that takes place therein in response to the heat applied at the time of forming the ball portion. Here, by forming the outer layer of the multilayer copper bonding wire to the thickness of not smaller than 0.01 µm and not larger than 0.4 µm, there can be satisfied the conflicting properties of stabilizing the low loop bondability and increasing the first pull strength, especially in a multilayer chip. Here, when the thickness of the outer layer is smaller than 0.01 µm, the effect of increasing the first pull strength in a multilayer chip is small. Meanwhile, when the thickness of the outer layer is greater than 0.4 µm, there exists a difficulty in increasing the first pull strength when performing low loop bonding. Particularly, when performing super-low loop bonding, a large variation in the first pull strength was confirmed if the thickness of the outer layer was not larger than 50 μm.

As for the bonding structure, other than the first concentrated portion 10 formed in the ball-root region, there can be achieved an effect of improving a leaning property when performing high loop bonding in a single layer chip structure, if formed between the outer layer and core member of the multilayer copper bonding wire is a diffusion layer that has a concentration gradient of copper and at least one of the aforementioned noble metals and is formed to a thickness of not smaller than 0.003 μm and not larger than 0.15 μm. That is, it is desired that the multilayer copper bonding wire have: the core member that is mainly composed of copper; and the outer layer that is formed on the core member and is mainly composed of at least one noble metal selected from the group of Pd, Au, Ag and Pt, that the diffusion layer having the concentration gradient of copper and at least one of the aforementioned noble metals be formed between the outer layer and the core member, and that the corresponding diffusion layer be formed to the thickness of not smaller than 0.003 μm and not larger than 0.15 μm. Leaning that occurs when performing high loop bonding, refers to a phenomenon where an upstanding section (heat-affected section) on the ball-bonded portion leans. At that time, a defect such as an electrical short occurs if adjacent wires come into contact with each other. Leaning that occurs when performing high loop bonding can be easily distinguished due to the fact that it is different from the aforementioned root leaning in, for example, a deformation direction and length of the wire. Root leaning refers to the phenomenon where the local portion (20-50 μm) of the wire root deforms toward the second bonding direction. In contrast, leaning that occurs when performing high loop bonding, particularly refers to a phenomenon where deformation takes place toward the direction of an adjacent multilayer copper bonding wire, which is a direction orthogonal to the second bonding direction. The deformation length generally employs a long range of 100 μm for deformation. Further, while leaning becomes a problem when performing high loop bonding on a single layer chip, root leaning becomes a problem in a multilayer chip. Other than the first concentrated portion 10, the diffusion layer that has the concentration gradient and is formed between the outer layer and the core member, brings about an effect of alleviating complex external forces that are applied to the wire subjected to loop control, thereby making it possible to reduce leaning Following are the reasons for the thickness of the diffusion layer to be not smaller than 0.003 μm and not larger than 0.15 μm. That is, when the thickness of the diffusion layer is smaller than 0.003 μm, the effect of improving the leaning property is small. Meanwhile, a thickness of greater than 0.15 μm results in an unstable loop control when performing low loop bonding.

It is desired that there be employed two or more kinds of noble metals in total including Pd and at least one of Au and Ag, and that a ratio of a total concentration of Au and Ag to a Pd concentration be not lower than 0.01 and not higher than 0.4 in the aforementioned concentrated portion. When the first concentrated portion 10 is composed of an alloy containing two or more kinds in total of the noble metals including Pd and at least one of Au and Ag, not only the shape of the ball-bonded portion can be made closer to that of a true circle, but a wedge-bonded shape can also be stabilized. When the first concentrated portion 10 contains Pd, there can be achieved the high effect of further making the shape of the ball-bonded portion closer to that of a true circle. However, if employing Pd alone, there exists a concern that a usable life of the capillary may be short due to the fact that a capillary front end, when performing ball bonding, may wear due to, for example, a fine Pd powder or a seizure between the capillary front end and the first concentrated portion 10. In contrast, when the first concentrated portion 10 contains Pd and at least one of Au and Ag, the usable life of the capillary can be prolonged while still making the ball-bonded shape closer to that of a true circle. Following are the reasons for the ratio of the total concentration of Au and Ag to the Pd concentration to be not lower than 0.01 and not higher than 0.4. That is, when this ratio is lower than 0.01, the aforementioned effect is small. Meanwhile, a ratio of greater than 0.4 results in a defect such as a petal-shape deformation of the ball-bonded portion. Here, it is desired that such concentration ratio be measured by first measuring random concentrations at not less than three locations in the first concentrated portion 10, followed by calculating an average value of concentration ratios obtained in the aforementioned locations.

As a multilayer copper bonding wire for forming the first concentrated portion 10 composed of the alloy containing two or more kinds in total of the noble metals including Pd and at least one of Au and Ag, it is desired that there be employed either: a multilayer copper bonding wire having an outer layer that is mainly composed of Pd and a concentrated layer of at least one of Au and Ag that is formed on a surface of such outer layer; or a multilayer copper bonding wire having an outer layer that is mainly composed of Pd and a concentrated layer of at least one of Au and Ag that is formed in an interface between such outer layer and the core member. That is, regardless of whether the concentrated layer of at least one of Au and Ag is formed on the surface of the outer layer or in the interface between the outer layer and the core member, there can be formed the first concentrated portion 10 composed of the aforementioned alloy, thus achieving an effect of reducing the wear of the capillary front end. Preferably, in either case, it is desired that a ratio of a total concentration of Au and Ag in the concentrated layer of at least one of Au and Ag to a Pd concentration be not lower than 0.01 and not higher than 0.4. When such concentration ratio is lower than 0.01, the effect of reducing the wear of the capillary front end is small. Meanwhile, a concentration ratio of greater than 0.4 leads to a noticeable hardening due to alloying, thus imposing a problem of wearing an inner section of the capillary and shortening an operating life thereof accordingly. Preferably, there can be achieved a higher effect of reducing the wear of the capillary front end, by employing a bonding structure formed with the multilayer copper bonding wire having: the outer layer that is mainly composed of Pd; and the concentrated layer of at least one of Au and Ag that is formed on the surface of the outer layer. The reason for that is assumed as follows. That is, the concentrated layer of at least one of Au and Ag that is formed on the surface of the outer layer, is assumed to reduce a frictional resistance between the wire itself and an inner wall of the capillary when forming loops.

Further, the inventors of the present invention confirmed that different improvement effects could be achieved with different structures of the multilayer copper bonding wire. For example, as for the bonding structure formed with the multilayer copper bonding wire having: the outer layer that is mainly composed of Pd; and the concentrated layer of at least one of Au and Ag that is formed on the surface of the outer layer, there could be achieved a high effect of further improving the usable life of the capillary by reducing a Pd exposure on a wire surface. Particularly, in some cases, the life of the capillary was also confirmed to have improved by 30% or more as a result of performing bonding with an extra-fine wire whose diameter was not larger than 17 μm, such extra-fine wire being significantly subject to the influence of the wire surface. Meanwhile, as for the bonding structure formed with the multilayer copper bonding wire having: the outer layer that is mainly composed of Pd; and the concentrated layer of at least one of Au and Ag that is formed in the interface between the outer layer and the core member, there was confirmed an effect of improving a vibration resistance at the time of transportation after performing bonding.

In order to promote the formations of the first concentrated portion 10, the second concentrated portion 11 and the third concentrated portion 12, it is desired that each concentrated portion be formed in the initial ball portion (Free Air Ball; referred to as "FAB" hereunder) that is not yet bonded. The reasons for that are, for example, as follows. That is, the concentrated portions can first be easily formed when forming the FAB. Further, through a process by which the ball portion deforms and a heating process that takes place after performing bonding, the distributions and concentrations or the like of the concentrated portions can be maintained in many cases even when slight changes have occurred in the shapes and sizes of the concentrated portions in the FAB.

Figure 7:
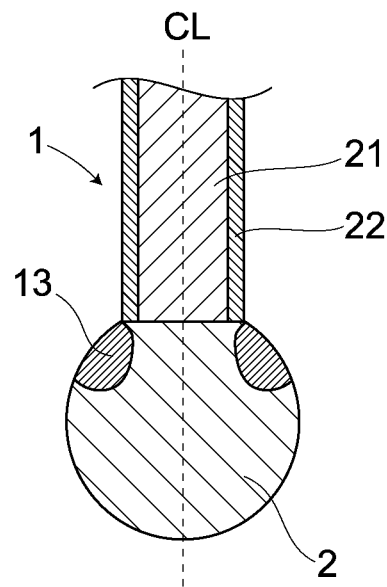
FIG. 7 is a cross-sectional view that is taken on the X-X direction in FIG. 2 and shows an initial ball portion having a terminal concentrated portion, in the working example of the present invention.
Figure 8:
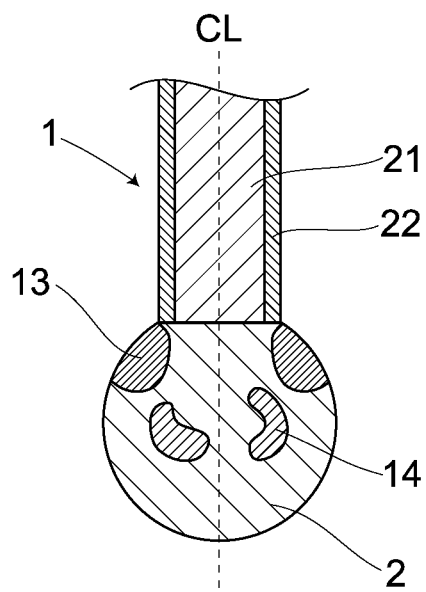
FIG. 8 is a cross-sectional view that is taken on the X-X direction in FIG. 2 and shows an initial ball portion having an inner concentrated portion, in the working example of the present invention.

FIG. 7 through FIG. 10 show typical examples of the distributions of the concentrated portions that are observed on a cross section of the FAB. In FIG. 7, a terminal concentrated portion 13 is formed in the ball-root region that is located in the vicinity of the boundary with the multilayer copper bonding wire. The terminal concentrated portion 13 corresponds to the first concentrated portion 10 formed after performing bonding. The terminal concentrated portion 13 is formed on the entire circumference of the neck portion. Preferably, the terminal concentrated portion 13 exhibits substantially similar cross-sectional structures in any cross section that is orthogonal to the bonded interface In FIG. 8, other than the first concentrated portion 10, an inner concentrated portion 14 is formed inside the ball portion. The inner concentrated portion 14 corresponds to the second concentrated portion 11 formed after performing bonding. The inner concentrated portion 14 may or may not exhibit similar shapes in any cross section that is orthogonal to the bonded interface. Further, the shapes and number of the inner concentrated portions 14 are not limited to those shown in FIG. 8.

Figure 9:
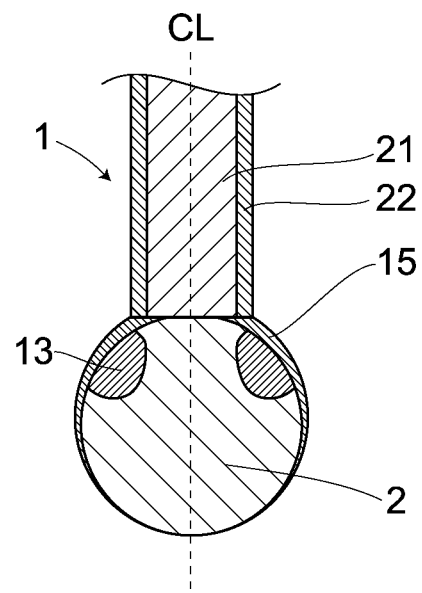
FIG. 9 is a cross-sectional view that is taken on the X-X direction in FIG. 2 and shows an initial ball portion having a surface concentrated portion, in the working example of the present invention.
Figure 10:
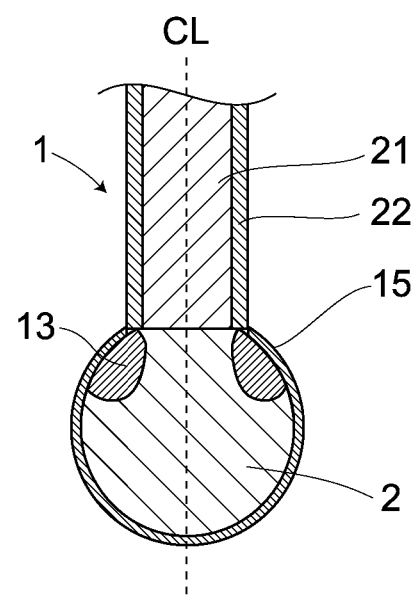
FIG. 10 is a cross-sectional view that is taken on the X-X direction in FIG. 2 and shows an initial ball portion having a surface concentrated portion, in the working example of the present invention.

In FIG. 9 and FIG. 10, other than the terminal concentrated portion 13, a surface concentrated portion 15 is formed in the vicinity of a surface of the ball portion. The surface concentrated portion 15 corresponds to the third concentrated portion 12 formed after performing bonding. FIG. 9 shows an example where the surface concentrated portion 15 formed ranges to a ball outer circumference located in the vicinity of a ball front end. Meanwhile, FIG. 10 shows an example where a concentrated layer formed on the ball outer circumference is relatively thick, i.e., the surface concentrated portion 15 is formed even on the ball front end. Preferably, the surface concentrated portion 15 exhibits substantially similar cross-sectional structures in any cross section that is orthogonal to the bonded interface. The third concentrated portion 12 in the bonded interface can also be formed as follows. That is, element(s) dissolved in the ball portion diffuse when heated after performing bonding, thereby promoting concentration. For example, it has been confirmed that even when the surface concentrated portion 15 is not observed on the ball front end as is the case in FIG. 9, element(s) dissolved in the ball portion will diffuse after performing bonding, thereby making it possible to form the third concentrated portion 12.

As for the bonding structure of the present mode, it is desired that there be bonded the ball portion that is formed of the FAB containing the concentrated portion(s) therein. For example, as for the bonding structure, it is desired that there be bonded a ball portion formed of the following type of ball portion (FAB) that is not yet bonded, i.e., a type of ball portion with a concentrated portion of the aforementioned noble metal(s) other than copper formed in the ball-root region which is the surface region located in the vicinity of the boundary with the multilayer copper bonding wire. Preferably, as for the aforementioned bonding structure, it is desired that there be bonded the ball portion that is formed of the ball portion (FAB) with the concentrated portions formed not only in the ball-root region but also inside the ball portion (FAB). More preferably, as for the bonding structure, it is desired that there be bonded the ball portion that is formed of the ball portion (FAB) with the concentrated portions formed not only in the ball-root region but also on a surface of the corresponding FAB.

Here, if only forming the first concentrated portion 10 of the aforementioned noble metal(s) in the ball-root region of the surface region of the ball-bonded portion, such first concentrated portion 10 can be formed stably to a certain extent by basically employing proper normal wire bonding conditions. However, in order to stably form the first concentrated portion 10 in a mass production process employing high-speed bonding, it is desired that at least one of the ball-formation factors including a process factor and a wire-material factor be controlled. As for a process factor, it is effective to employ, for example, proper ball-formation conditions for spraying a shielding gas and performing arc discharge in the vicinity of a wire front end. Meanwhile, as for a wire-material factor, it is effective to employ a proper structure of the multilayer copper bonding wire.

Figure 11:
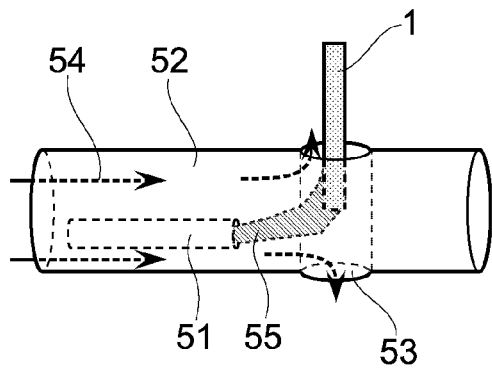
FIG. 11 is an explanatory diagram showing a shielding pipe method of the working example of the present invention, the shielding pipe method being a method for forming a gas-shielded atmosphere.

Favorable ball-formation conditions for forming the first concentrated portion 10, include: spraying the shielding gas from a rear side of an electrode torch toward the wire front end; and vertically forming a bidirectional flow of the shielding gas along the multilayer copper bonding wire, i.e., in the vicinity of the wire front end. Effects brought about by such conditions include, for example: preferentially shielding a region subjected to arc discharge; or forwarding arc discharge upward to the wire such that the ball portion can be cooled rapidly when being solidified from a melt state. Here, the formation of the first concentrated portion 10 can be promoted by improving the aforementioned effects. FIG. 11 shows a shield-pipe method as an example of easily forming the aforementioned flow of the shielding gas. The method is effective for the following reasons. That is, while an electrode torch 51 is covered by a shielding pipe 52, provided on such shielding pipe 52 is a vertical through hole 53 for vertically passing a capillary holding the multilayer copper bonding wire 1 therethrough. Further, a shielding-gas flow 54 is formed inside the corresponding shielding pipe 52. This method makes it easy to simultaneously allow the shielding gas to be flowed from a rear side of the discharging electrode torch 51, and the vertical shielding-gas flow to be formed along the multilayer copper bonding wire 1. While described so far is an example of a shield-pipe method such as the one shown in FIG. 11, a gas shielding method is actually not limited to that shown in FIG. 11. In fact, it is possible to develop a method for forming the first concentrated portion 10, even based on an other method for controlling the gas flow.

As the shielding gas used to stably form the first concentrated portion 10, it is desired that the shielding gas be either a pure nitrogen gas or a reducing gas containing 4-6% of hydrogen in nitrogen, and that such shielding gas be used at a flow rate of 0.3-1.0 ml/min. Further, it is also desired that a size of a vertical through hole employed in a shield-pipe method be 1.2 to 3.0 times larger than a diameter of the capillary. Preferably, when the flow rate is 0.4-0.8 ml/min or when the size of the vertical through hole is 1.4 to 2.7 times larger than the diameter of the capillary, the formation of the first concentrated portion 10 can be promoted as a result of an intensive concentration occurring in the neck portion. More preferably, when the size of the vertical through hole is 1.6 to 2.3 times larger than the diameter of the capillary, the first concentrated portion 10 can be formed more stably using the thin wire having the wire diameter of not larger than 18 μm.

As for a favorable wire-material factor for forming the first concentrated portion 10, it is effective when the thickness of the outer layer of the multilayer copper bonding wire is not smaller than 0.01 μm and not larger than 0.4 μm, when a Cu concentration on the surface of the outer layer is low, and when no Cu oxide is formed thereon. The reasons for that are assumed as follows. That is, when a Cu exposure on the wire surface is small or when no Cu oxide is formed thereon, there can be delayed a mixing between the outer layer and copper at the time of performing arc discharge, thereby promoting an effect of causing the outer layer to concentrate in the ball-root region. When the thickness of the outer layer is greater than 0.4 μm, concentration toward the ball-root region is restricted. It is desired that a thickness of the Cu oxide on the surface of the outer layer be not larger than 4 nm, and that the Cu concentration be not higher than 2 mol %. If the thickness of the Cu oxide is greater than 4 nm, or if Cu is exposed on the outer layer surface at a concentration of greater than 2 mol %, a mixing between the noble metal(s) and Cu occurs when the ball portion is in the melt state, thus restricting the formation of the first concentrated portion 10. Here, although the Cu oxide is described as a main oxide, similar facts were also confirmed with a Pd oxide and an Ag oxide.

More preferably, when the Cu oxide and an organic substance exist in the vicinity of the interface between the outer layer and the core member, the first concentrated portion 10 can then be stably formed in an effective manner. It is assumed that the mixing between the noble metal(s) and Cu that occurs when the ball portion is in the melt state can be further restricted, if the Cu oxide and the organic substance exist in the interface between the outer layer and the core member. Here, it is desired that a film thickness of the Cu oxide and the organic substance be not smaller than 0.1 nm and not larger than 5 nm. When the corresponding film thickness is smaller than 0.1 nm, the aforementioned function is achieved at a low level. Meanwhile, a film thickness of greater than 5 nm reduces an adhesion between the outer layer and the core member such that peeling occurs. Preferably, when such film thickness is not smaller than 0.5 nm and not larger than 3 nm, there can be promoted a phenomenon where the noble metal(s) of the outer layer are to be concentrated in the ball-root region in the melt state. Often, it is difficult to confirm the existences of the Cu oxide and the organic substance that are located in the vicinity of the interface between the outer layer and the core member of the multilayer copper bonding wire. Therefore, a film thickness of the Cu oxide and the organic substance that are observed through a surface analysis performed on the core member prior to forming the outer layer, may be not smaller than 0.1 nm and not larger than 5 nm.

Figure 12:
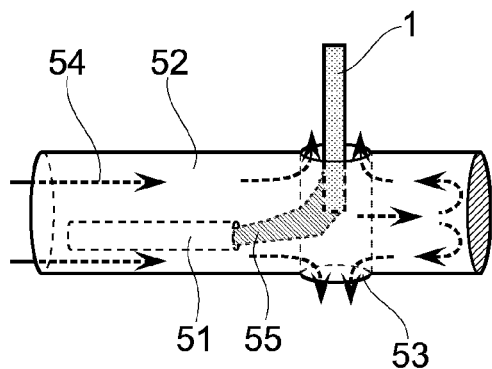
FIG. 12 is an explanatory diagram showing a sealed-shielding pipe method of the working example of the present invention, the sealed-shielding pipe method being a method for forming a gas-shielded atmosphere.
Figure 13:
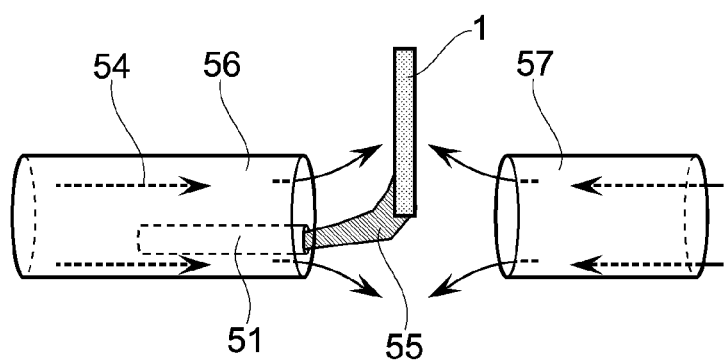
FIG. 13 is an explanatory diagram showing a bidirectional gas-spraying method of the working example of the present invention, the bidirectional gas-spraying method being a method for forming a gas-shielded atmosphere.

Other than the first concentrated portion 10, in order to promote the formation of the second concentrated portion 11 inside the ball portion, it is desired that at least one of the ball-formation factors including a process factor and a wire-material factor be controlled. As for a process factor, it is effective to flow the shielding gas from two directions including the rear side of the electrode torch and an opposite side thereof. It is assumed that such bidirectional gas flow promotes a convection and stirring inside the ball portion at the time of melting the wire through arc discharge, thereby mixing the noble metal(s) of the outer layer and Cu, thus promoting the formation of the second concentrated portion 11. Described hereunder are two effective methods for flowing the shielding gas. A first method shown in FIG. 12 is a slight modification of the method shown in FIG. 11, where the shielding pipe 52 is used to cover the electrode torch 51, and a front end of such shielding pipe 52 is closed. This method allows there to be slightly formed an adverse gas-current also from the opposite side of the electrode torch 51. Further, this method allows a wire sweep along a vertical direction of the multilayer copper bonding wire to be promoted, thereby improving an arc concentration and the effect of rapidly-cooling the ball portion, thus making it possible to form the first concentrated portion 10 more stably. A second method shown in FIG. 13 is a method where the shielding gas is forcibly flowed from two directions, using: a rear pipe 56 provided on the rear side of the electrode torch 51; and a front pipe 57 provided on the opposite side of the electrode torch 51. Things to keep mind when using the second method are as follows. That is, since the method ensures a degree of freedom for installing the pipes, angles and heights or the like of the corresponding pipes need to be appropriately adjusted such that there can be formed a shielded environment where oxidation does not occur at the time of forming the ball portion. The point of employing these methods is that the noble metal (s) of the outer layer and Cu can be mixed together as a result of promoting the convection and stirring inside the ball portion at the time of melting the wire. However, the present invention may employ methods other than those described above.

As for a preferable wire-material factor for forming the second concentrated portion 11, it is effective to control the thicknesses of the outer layer and the diffusion layer of the multilayer copper bonding wire. It is desired that the thickness of the outer layer be not smaller than 0.03 μm and not larger than 0.2 μm, or the thickness of the diffusion layer formed between the outer layer and the core member be not smaller than 0.03 μm and not larger than 0.15 μm, and that a total thickness of the outer layer and the diffusion layer be not smaller than 0.07 μm and not larger than 0.4 μm. When the thicknesses of the outer layer and the diffusion layer are within such ranges, the noble metal(s) and Cu can be mixed together when the ball portion is in the melt state, thereby promoting the formation of the second concentrated portion 11 inside the ball portion. Here, following is an example of a reason for the thickness of the outer layer to be not smaller than 0.03 μm, the thickness of the diffusion layer formed between the outer layer and the core member to be not smaller than 0.03 μm, and the total thickness of the outer layer and the diffusion layer to be not smaller than 0.07 μm. That is, when the aforementioned thicknesses are smaller than their lower limits, function effects achieved are small. However, an outer layer thickness of greater than 0.4 μm hardens the ball portion, thus imposing a problem of incurring chip damages at the time of performing bonding. Further, a diffusion layer thickness of greater than 0.15 μm results in a resistance when the wire deforms at an acute angle, thus resulting in unstable loop shapes when employing, for example, a short span. Furthermore, it was confirmed that it was difficult to stably form the first concentrated portion 1 when the total thickness of the outer layer and the diffusion layer was greater than 0.4 μm. Here, the less there exist the Cu oxide and the organic substance in an interface between the outer layer and the diffusion layer, the further the formation of the second concentrated portion 11 can be promoted.

As for a boundary between the outer layer and the diffusion layer that are formed on the wire surface, the outer layer is defined as a region where the concentration of the main component thereof is not lower than 50 mol %, whereas the diffusion layer is defined as a region where the concentration of the main component thereof is not lower than 10 mol % and not higher than 50 mol %.

Other than the first concentrated portion 10, in order to promote the formation of the third concentrated portion 12 in the ball-bonded interface, it is effective to form a concentrated layer in the vicinity of the ball surface of the initial ball portion (FAB) that is not yet bonded. As a method thereof, it is desired that at least one of the ball-formation factors including a process factor and a wire-material factor be controlled. As for a process factor, it is desired that a current value be increased by shortening an arc-discharge time in a gas shielding method such as the method shown in FIG. 12 or FIG. 13. By shortening the discharge time, there can be improved a function of allowing solidification to take place before the noble metal(s) of the outer layer and Cu of the core member are mixed together when the ball portion is in the melt state, thereby promoting a phenomenon where the noble metal(s) are concentrated on the surface. Although an absolute value of the discharge time may vary based on the wire diameter, an FAB diameter, a model of a bonding device or the like, it is desired, for example, that the current value be 75-95 mA and the discharge time be 0.4-0.6 msec if the wire diameter is 25 μm and the FAB diameter is 50 μm, and that the current value be 30-50 mA and the discharge time be 0.5-0.7 msec if the wire diameter is 20 μm and the FAB diameter is 40 μm. As for comparison, a general discharge condition where the current value is 60-75 mA and the discharge time is 0.4-0.6 msec, is often employed when using a normal copper wire of a wire diameter of 25 μm and forming an FAB diameter of 50 μm.

As for a wire-material factor for promoting the formation of the third concentrated portion 12, it is effective when the diffusion layer thickness of the multilayer copper bonding wire is not smaller than 0.01 μm and not larger than 0.1 μm, and a ratio Y of the diffusion layer thickness to the outer layer thickness is not lower than 0.05 and not higher than 0.4. The reasons for that are assumed as follows. That is, if the outer layer thickness is within the aforementioned range and the diffusion layer is formed relatively thin to the outer layer, the noble metal(s) are restricted from, for example, mixing with Cu and dispersing in Cu when the ball portion is in the melt state, thereby improving the effect of causing the noble metal (s) to be concentrated on the ball surface. Here, when the ratio Y is greater than 0.4, a thick diffusion layer promotes the mixing between the noble metal(s) and Cu, thus making the formation of the third concentrated portion unstable. Meanwhile, a ratio Y of lower than 0.05 not only makes it difficult to form the third concentrated portion, but also results in a lower adhesion between the outer layer and the core member due to a thinness of the diffusion layer such that an unstable loop shape is eventually resulted.

Other than the first concentrated portion 10, in order to promote the formations of the second concentrated portion 11 and the third concentrated portion 12 in the ball-bonded interface, it is effective to form the outer layer to a thickness of not smaller than 0.15 μm and not larger than 0.4 μm, and to allow the ratio Y of the diffusion layer thickness to the outer layer thickness to be within a range of not lower than 0.6 and not higher than 1.2. The reasons for that are assumed as follows. That is, when the diffusion layer is formed relatively thick to the outer layer such that the ratio of the diffusion layer thickness falls in the aforementioned range, the mixing between the noble metal(s) and Cu is promoted, thereby causing the first concentrated portion and the second concentrated portion to be formed substantially simultaneously in a relatively early stage of the melt state of the ball portion. Further, a remaining noble metal(s) that have failed to concentrate in a ball terminal section or inside the ball portion, are then concentrated on the ball surface such that the third concentrated portion can be formed at the end. When the outer layer thickness is smaller than 0.15 μm, there exists a concern that fewer second concentrated portions may be formed. When the ratio Y is lower than 0.6, the second concentrated portion may be formed in a non-uniform and unstable manner, provided that the outer layer thickness is within the aforementioned range. Meanwhile, a ratio Y of not smaller than 1.2 results not only in an insufficient formation of the third concentrated portion, but also in a decreased linearity of the wire due to a larger wire processing strain called curl that occurs at the time of manufacturing the wire.

Wire-material factors for promoting the formations of, for example, the first, second and third concentrated portions are not limited to those described above. In fact, other material factors (e.g., film thickness, composition, distribution) may also be employed to form the aforementioned concentrated portions, as long as the multilayer copper bonding wire is used. Further, it was confirmed that the function effects of the first, second and third concentrated portions could be achieved simply when the corresponding concentrated portions existed, and that such function effects were not directly affected by the multilayer copper bonding wire's wire-material factors for forming the concentrated portions.

As for a bonding structure having the concentrated portions, the ball-bonded portion may be either: a ball-bonded portion formed through a normal wire-bonding method where loops are to be formed; or a ball-bonded portion formed through a stud bump method. The difference between these two methods is whether or not loops are to be formed, i.e., the two methods result in a substantially identical structure and prescribed properties of the ball-bonded portion.

As a method for confirming the formations of the first, second and third concentrated portions in the ball portion, it is easy and effective to observe a cross section of the ball-bonded portion that is parallel to a wire longitudinal direction. As a method for confirming a distribution of the concentrated portions, it is easy to perform a color identification through an observation made with an optical microscope. Here, it was confirmed that there could be performed an identification based on deepness of color, as long as the concentration of a concentrated portion was not lower than 0.1 mol %. Further, the distribution of the concentrated portions can be identified more precisely, if employing EPMA (Electron Probe Micro Analyzer), EDX (Energy Dispersive X-ray spectrometry), AES (Auger Electron Spectroscopy) or the like to perform an elemental analysis on the cross section of the ball-bonded portion, i.e., to confirm a local concentration(s) or perform mapping per element. Further, a concentrated portion can also be confirmed in a location other the cross section of the ball-bonded portion. For example, as for the first concentrated portion 10, it is also effective to perform an elemental analysis on the ball-root region of the surface of the ball-bonded portion. Furthermore, as for the confirmation of the third concentrated portion 12, it is also effective to perform a linear analysis across the bonded interface, using chemical analysis methods such as EDX, EPMA and AES. When the locations of the concentrated portions are clear, a point analysis can also be employed as an easy method. However, when performing a point analysis to evaluate the existence or nonexistence of concentration, it is desired that at least two locations including a concentrated region and an unconcentrated region be analyzed, and that a relative comparison be made thereafter.

As for a sample used to carry out the observation and analysis of the concentrated portions, there can be used either: a shipped end product of a semiconductor; or a semiconductor that has been installed in an electronic device and put into practical use. That is, regardless of whether the ball-bonded portion is formed on the semiconductor that has been shipped or the semiconductor that has already been put into practical use, the aforementioned function effects can be achieved as long as the concentrations or thicknesses of the concentrated portions fall in the ranges of the present example.

When manufacturing the multilayer copper bonding wire, the outer layer that is mainly composed of, for example, Pd, Au, Ag and Pt, is to be formed on the surface of the core member that is mainly composed of Cu, through electrolytic plating, non-electrolytic plating or sputtering. From the perspectives of productivity and uniformity, it is desired that the wire diameter of the core member be as large as 0.05-1.5 mm when forming the outer layer. If necessary, AES may be employed to observe a Cu oxide film, an organic film or the like that are formed on the surface of the core member prior to forming the outer layer. Here, by performing electrolytic etching, acid cleaning or the like on copper as generally practiced, the Cu oxide film, the organic film or the like on the surface of the core member can be adjusted to predetermined thicknesses.

After forming the outer layer, a drawing die(s) are used to draw the wire to a predetermined final diameter. Here, a reduction rate in area of die is within a range of 3-15%. Further, a heat treatment is performed when the wire is being drawn after forming the outer layer, or when the wire has been drawn to the final wire diameter. Particularly, a continuous heat treatment was performed while continuously moving the wire inside a heat-treating furnace. A temperature for heat treatment was within a range of 300-800° C., and the heat treatment was actually performed while flowing an inert gas such that an oxidation of the wire could be controlled.

When forming an outer layer of a double-layered structure, such as when forming the concentrated layer on the surface of the outer layer or between the outer layer and the core member, it is desired that electrolytic plating, non-electrolytic plating or sputtering be performed twice separately, followed by performing a heat treatment at a temperature of 200-600° C. to form the concentrated layer.

WORKING EXAMPLES

Working examples are described hereunder.

Raw materials of a multilayer copper bonding wire were as follows. That is, there was used a Cu having a purity of about 99.99% by mass or higher, which was a high-purity material. As for materials of an outer layer, there were prepared Pd, Au, Ag and Pt, all of which had a purity of about 99.99% by mass or higher. The multilayer copper bonding wire was manufactured as follows. That is, as a core member, there was prepared in advance a high-purity copper wire whose wire diameter had been thinned down to a certain extent. Further, on a surface of such copper wire, there was then formed the outer layer made of a different metal(s), through electrolytic plating. Here, an initial film thickness of the outer layer was calculated based on a thinned film thickness thereof at a final wire diameter. A heat treatment was carried out in a range of 200-600° C., if promoting formations of concentration gradients and generations of diffusion layers.

A thin-film formation for forming a concentrated layer other than the outer layer, was required when, for example, forming the concentrated layer on a surface of the outer layer, or forming the concentrated layer between the outer layer and the core member. In order to form the outer layer and a thin film as the concentrated layer, it was effective to perform in twice a film formation using electrolytic plating, electroless plating or sputtering. The outer layer and the thin film as the concentrated layer shared common main components that were Pd, Au, Ag and Pt. While the outer layer and the thin film as the concentrated layer exhibited different film thicknesses, they were basically formed under similar conditions. If necessary, a heat treatment for improving an adhesion was performed in a temperature range of 200-600° C., after carrying out the film formation for the first time or after carrying out the film formation for the second time.

There were employed a method of forming the outer layer at the final wire diameter, and a method of forming the outer layer at a certain wire diameter and then thinning a wire thus obtained to the final wire diameter through a drawing process. As for an electrolytic plating solution and an electroless plating solution, there were used commercially available plating solutions for semiconductor. A wire having a diameter of about 200-1500 μm was prepared in advance. The wire thus prepared then had a surface thereof coated through, for example, vapor deposition or plating, followed by being drawn to a final wire diameter of 15-25 μm. A processing strain was cleared after carrying out the drawing process, followed by performing a heat treatment such that an elongation value became about 4-18%. A method for performing the heat treatment was as follows. That is, there was used an infrared heating furnace having a soaking area of 10 cm or larger. While an inert gas was being flowed at a flow rate of 0.5-5 L/min into the furnace that was set to a temperature of 300-750° C., the wire was continuously moved therein with a dragging tension of 2-30 mN and a rate of 30-100 m/min. Here, the temperature was finely controlled such that a tensile elongation became 4-15%. Further, copper oxidation on a wire surface was controlled by continuously flowing the inert gas (a nitrogen gas) into the furnace at the flow rate of 0.5-5 L/min. If necessary, a further drawing process was carried out after performing a diffusion heat treatment that was performed after the wire had been drawn to a wire diameter of 30-200 μm through dies. Conditions of the diffusion heat treatment were within a range of conditions of the aforementioned heat treatment.

When performing a concentration measurement on a concentrated portion formed on a surface or cross section of a ball portion, AES was used if a size of the concentrated portion was smaller than 1 μm, whereas EPMA or EDX was used if the size of the concentrated portion was not smaller than 1 μm. When measuring, for example, film thicknesses on a surface of the multilayer copper wire, AES was used to perform surface and depth analyses, where absolute values of the thicknesses were then expressed through $SiO_2$ conversion as commonly practiced. Concentrations of electrically conductive metals in the wire were measured through ICP (Inductively coupled plasma) spectrometry, ICP-mass spectrometry or the like.

AES measurement was performed to mainly obtain, for example, the film thickness of the outer layer, a film thickness of a diffusion layer, a Cu concentration on the surface of the outer layer, a thickness of a Cu-oxide on the surface of the outer layer, and a total film thickness of a Cu-oxide and organic substance on the surface of the core member. Here, for convenience of measurement, a film thickness of a Cu-oxide and organic substance in an interface between the outer layer and the diffusion layer, was substituted by a total film thickness of the Cu-oxide and organic substance on the surface of the core member that had been measured before forming the outer layer. Film thicknesses were defined as follows. That is, the outer layer was defined as an area exhibiting a main component concentration of not lower than 50 mol %. The diffusion layer was defined as an area exhibiting a main component concentration of not lower than 10 mol % and not higher than 50 mol %. Further, the Cu-oxide was defined as a region exhibiting an oxygen concentration of not lower than 30 mol %. A total film thickness of the Cu-oxide and organic substance on the surface of the core member, was defined as a region exhibiting a total concentration of oxygen and carbon of not lower than 50 mol %. Here, total film thicknesses expressed in terms of final wire diameters are listed in Tables.

When employing a normal method for manufacturing the core member composed of Cu, it was confirmed that the total film thickness of the Cu-oxide and organic substance on the surface of the core member was about 5 nm before forming the outer layer. In order to control the film thickness of the Cu-oxide and organic substance remaining on the surface of the core member, it is effective to perform a cleaning treatment such as acid cleaning, alkali degreasing, pure water cleaning or the like immediately before forming the outer layer. The aforementioned cleaning treatment was a type of treatment normally performed to clean Cu. For instance, the examples of the present invention mainly used a diluted solution of nitric acid and hydrogen peroxide water to perform pickling, and a diluted solution of KOH to perform alkali degreasing.

The multilayer copper bonding wire was bonded as follows. That is, a commercially available automatic wire bonder (ASM: Eagle 60-AP) was used to perform ball portion/wedge bonding. Particularly, the ball portion was formed on a wire front end through arc discharge, followed by bonding such ball portion to an electrode film on a silicon substrate and bonding an other end of the wire to a lead terminal through wedge bonding.

Four kinds of methods were used as gas shielding methods for controlling oxidation at the time of forming the ball portion. Specifically, there were employed: a method (P) of flowing a gas from a shielding pipe covering an electrode torch, as shown in FIG. 11; a method (Q) that is based on the method (P) and uses a shielding pipe with a front end thereof sealed, as shown in FIG. 12; a method (S) of bi-directionally flowing the gas from a rear pipe disposed on a rear side of the electrode torch and a front pipe disposed on an opposite side of the electrode torch, as shown in FIG. 13; and a method (T) of flowing the gas only from the front pipe of the method (S). The aforementioned methods are respectively denoted by P, Q, S and T in a column titled "gas shielding method" in Table 1. As a shielding gas, there was used a nitrogen gas with a purity of 4N or higher, or a reducing gas obtained by allowing nitrogen to contain hydrogen by 4-6%. Here, a gas flow rate was set to 0.4-1.5 ml/min.

As the electrode film that is formed on the silicon substrate and serves as a bonding-target portion, there was used an Al alloy film (Al-1% Si-0.5% Cu film, Al-0.5% Cu film) of a thickness of 1 μm. As an electrode on a resin substrate, there was used an electrode of Au plating (0.1 μm)/Ni plating (0.4 μm)/Cu (10 μm). A bonding temperature for a bonding process was set to 175° C.

Three kinds of multilayer chips were used. Particularly, there were used three kinds of semiconductor chips of a thickness of 150 μm, the semiconductor chips being different from one another in size. Here, smaller semiconductor chips were stacked on top to form a triple-layer pyramid structure. The semiconductor chips were bonded to one another with a general adhesion tape called Die Attach Film (thickness: about 30 μm). This type of multilayer chip is referred to as a conventional multilayer chip. Further, there was used a multilayer structure formed by stacking in three layers semiconductor chips of the thickness of 150 μm and a same size. In this case, wire bonding was performed on each layer of the semiconductor chip, followed by bonding thereto a next semiconductor chip as an upper layer. This type of multilayer chips can be divided into two categories based on methods for bonding the semiconductor chips to one another, one of them being a multilayer structure shown in FIG. 1 where the semiconductor chips are bonded to one another on a dummy chip of a thickness of 50 μm, using the aforementioned Die Attach Film. This type of multilayer structure is referred to as an overhang-type multilayer chip. The other category is a multilayer structure shown in FIG. 4 where an adhesion film called FOW (thickness: about 120 μm) is used to perform bonding. This type of multilayer structure is referred to as an FOW-type multilayer chip. In the latter type of structure, bonding is so performed that the multilayer copper bonding wire bonded is to be partially covered by FOW.

A low loop bondability was evaluated as follows. That is, 50 low loops were joined to the conventional multilayer chip under a condition such that a wire length was about 2 mm, and a loop height was about 55 μm. Specifically, there were evaluated loop heights from semiconductor chip surfaces and neck damages. In a column titled "Loop height" in the Tables, double circles represent a condition superior for mass production, where an average value of the loop height was not larger than 55 μm. Further, circles represent a condition favorable for practical use, where the average value of the loop height was larger than 55 μm but not larger than 60 μm. Furthermore, triangles represent a condition where the average value of the loop height was larger than 60 μm but not larger than 65 μm, the condition being normally satisfactory but requiring that the loop condition be improved if possible. Furthermore, crosses represent a condition where the average value of the loop height was larger than 65 μm, the condition being problematic in terms of practical use at times. Low-loop neck damages were evaluated by joining 200 super low loops that are mentioned above. In a column titled "Neck damage" in the Tables, double circles represent a favorable condition where neck damage was found in none of the loops. Further, circles represent a condition that is problem-free in terms of practical use, where neck damage was found in not more than two loops. Furthermore, triangles represent a condition where neck damage was found in three to five loops, the condition requiring that the loop condition be improved if possible. Furthermore, crosses represent a poor condition where neck damage was found in not less than six loops.

A root leaning property resulting from low loop bonding was evaluated as follows. That is, 800 low loops were joined to the conventional multilayer chip under the condition such that the wire length was about 2 mm, and the loop height was about 55 μm. Specifically, this evaluation was carried out by counting the number of loops leaning from wire roots (root leaning) that are located in the vicinity of boundaries with ball-bonded portions. In a column titled "Root leaning" in the Tables, double circles represent a favorable condition where root leaning was observed in none of the loops. Further, circles represent a condition that is problem-free in terms of practical use, where root leaning was observed in not more than two loops. Furthermore, triangles represent a condition where root leaning was observed in three to five loops, the condition requiring that improvements be made if possible. Furthermore, crosses represent a poor condition where root leaning was observed in not less than six loops.

A stability of a first pull strength was evaluated as follows. That is, 50 low loops were joined to the conventional multilayer chip under the condition such that the wire length was about 2 mm, and the loop height was about 55 μm, followed by performing a first pull test by hooking sections of the loops that were within 100 μm from the ball-bonded portions. Specifically, there was evaluated a standard deviation of a breaking strength under such circumstance. In a column titled "Stability of first pull strength" in the Tables, double circles represent a favorable condition where the standard deviation of the first pull strength was less than 0.1. Further, circles represent a substantially favorable condition where the standard deviation of the first pull strength was not less than 0.1 but less than 0.3. Furthermore, triangles represent a condition where the standard deviation of the first pull strength was not less than 0.3 but less than 0.5, the condition requiring that improvements be made. Furthermore, crosses represent a poor condition where the standard deviation of the first pull strength was not less than 0.5.

A capillary wear property was evaluated as follows. That is, 10,000 low loops were joined to the conventional multilayer chip under a condition such that the wire length was about 2 mm, and the loop height was about 70 μm, followed by evaluating changes in, for example, an extent to which a capillary front end had worn and been tainted. Here, in order to accelerate, for example, the wear of the capillary front end, there was employed a loop condition where a reverse movement was more intensive in terms of a magnitude thereof. In a column titled "Capillary wear property" in the Tables, double circles represent a significantly favorable condition where a surface of the capillary front end was clean. Further, circles represent a substantially favorable condition where a size of an adhered substance was smaller than 5 μm. Furthermore, squares represent a condition that is problem-free in terms of normal operation, where the size of the adhered substance was not smaller than 5 μm but smaller than 10 μm. Furthermore, triangles represent a condition where the size of the adhered substance was not smaller than 10 μm but smaller than 20 μm, the condition requiring that improvements be made if possible. Furthermore, crosses represent a poor condition where the size of the adhered substance was not smaller than 20 μm.

A lift-off evaluation was carried out as follows. That is, the two types of multilayer chips including the conventional multilayer chip and the overhang-type multilayer chip, were used respectively to carry out a wire bonding operation using 1,000 wires. Specifically, this evaluation was carried by counting the number of wires with which peeling had occurred in an interface between the ball-bonded portion and the electrode film of Al alloy. Here, as a condition of an accelerated defect test, there were employed a lower load and ultrasonic vibration output. In a column titled "Lift-off defect" under both "Conventional multilayer chip" and "Overhang-type multilayer chip" in the Tables, double circles represent a favorable condition where no lift-off defect was observed. Further, circles represent a substantially favorable condition where only one or two wires exhibited a lift-off defect. Furthermore, triangles represent a condition where three to six wires exhibited the lift-off defect, the condition requiring that improvements be made. Furthermore, crosses represent a poor condition where not less than seven wires exhibited the lift-off defect.

An Al splash evaluation was carried out by using two types of chips including the conventional multilayer chip and a single layer chip. Specifically, the Al splash evaluation was carried out based on an amount of Al (Al splash) discharged to outer circumferences of ball-bonded portions formed with 200 wires. Here, as a condition of an accelerated defect test, there were employed a lower load and ultrasonic vibration output. In a column titled "Al splash" under both "Conventional multilayer chip" and "Single layer chip" in the Tables, double circles represent a condition where no Al splash defect was observed. Further, circles represent a substantially favorable condition where only one or two wires exhibited an Al splash defect. Furthermore, triangles represent a condition where three to seven wires exhibited the Al splash defect, the condition requiring that improvements be made. Furthermore, crosses represent a poor condition where not less than eight wires exhibited the Al splash defect.

A center defectiveness evaluation was carried out as follows. That is, a shear test was performed on 100 ball-bonded portions formed on the conventional multilayer chip, followed by observing fracture surfaces thereof on the aluminum side. A center defectiveness was identified when there was observed a region in a central section of the ball-bonded portion where bonding had been insufficient. In a column titled "Center defectiveness" in the Tables, double circles represent a condition where no center defectiveness was observed, the condition indicating that a superior bondability had been achieved. Further, circles represent a substantially favorable condition where the center defectiveness was observed in only one or two ball-bonded portions. Furthermore, squares represent a condition that is problem-free in terms of practical use, where the center defectiveness was observed in three to five ball-bonded portions. Furthermore, triangles represent a condition where the center defectiveness was observed in six to eight ball-bonded portions, the condition requiring that improvements be made. Furthermore, crosses represent a poor condition where the center defectiveness was observed in not less than nine ball-bonded portions.

A chip damage evaluation was carried out as follows. That is, the ball portions were bonded to the aluminum electrode film on the conventional multilayer chip, followed by performing etching so as to remove the electrode film. Damages on an insulation film or the silicon chip were then observed through SEM. Specifically, 200 electrodes were subjected to observation. In a column titled "Chip damage" in the Tables, double circles represent a condition where no damage was observed. Further, circles represent a problem-free condition where two or less cracks of a size of not larger than 5 μm were observed. Furthermore, triangles represent a worrisome condition where three or more cracks of the size of not larger than 5 μm were observed. Furthermore, crosses represent a problematic condition where one or more cracks of a size of not smaller than 10 μm were observed.

A ball bonding strength was evaluated as follows. That is, the shear test was performed on 40 ball-bonded portions formed on the overhang-type multilayer chip, followed by measuring an average value of a shear strength thus obtained. Specifically, there was used a shear strength per unit area that was calculated using an average value of an area of the ball-bonded portion. More specifically, this evaluation was carried out under two kinds of bonding temperatures including 170° C. and 150° C. In a column titled "Ball bonding strength" in Table 3, double circles represent a favorable condition where the shear strength per unit area was not lower than 110 MPa. Further, circles represent a condition that is problem-free in terms of practical use, where the shear strength per unit area was not lower than 90 MPa but lower than 110 MPa. Furthermore, triangles represent a condition where the shear strength per unit area was not lower than 70 MPa but lower than 90

MPa, the condition indicating that improvements could have been made through few changes in bonding conditions. Furthermore, crosses represent a condition where the shear strength per unit area was lower than 70 MPa, the condition indicating that the bonding strength had been insufficient.

A stability of a pressed-ball height was evaluated as follows. That is, the two types of multilayer chips including the overhang-type multilayer chip and the FOW-type multilayer chip, were respectively used in this evaluation where a standard deviation of the pressed-ball height at 500 ball-bonded portions was evaluated. In a column titled "Stability of pressed-ball height" under both "Overhang-type multilayer chip" and "FOW-type multilayer chip" in the Tables, double circles represent a favorable condition where the standard deviation of the pressed-ball height was less than 0.02. Further, circles represent a substantially favorable condition where the standard deviation of the pressed-ball height was not less than 0.02 but less than 0.05. Furthermore, triangles represent a condition where the standard deviation of the pressed-ball height was not less than 0.05 but less than 0.1, the condition requiring that improvements be made. Furthermore, crosses represent a poor condition where the standard deviation of the pressed-ball height was not less than 0.1.

A shape of the ball-bonded portion was evaluated as follows. That is, the FOW-type multilayer chip was used in this evaluation where 500 ball-bonded portions were subjected to observation for evaluation on, for example, circularity and excessive deformation. Particularly, observation was individually carried on a second and third semiconductor chips from the bottom. In a column titled "Ball-bonded shape" in the Tables, crosses represent a poor condition where not less than six ball-bonded portions exhibited a defective ball shape such as a petal shape or an anisotropic shape deviated from a shape of a true circle. Further, two types of evaluation were given when one to five ball-bonded portions had exhibited the defective ball shape such as the petal shape or the anisotropic shape. Specifically, triangles represent a condition where an excessive deformation such as a noticeable core deviation was observed in not less than one ball-bonded portion, the condition requiring that improvements be made if possible at a mass production level. Meanwhile, circles represent a usable condition where no excessive deformation was observed. Here, double circles represent a favorable condition where none of the ball-bonded portions exhibited the defective ball shape.

A long-span low loop bondability was evaluated as follows. That is, 200 super low loops were joined to the single layer chip under a condition such that the wire length was about 4 mm, and the loop height was about 55 μm, followed by evaluating neck damages. In a column titled "Long-span low loop bonding" in the Tables, double circles represent a favorable condition where none of the loops exhibited neck damage. Further, circles represent a condition that is problem-free in terms of practical use, where neck damage was observed in not more than three loops. Furthermore, triangles represent a condition where neck damage was observed in four to seven loops, the condition requiring that improvements be made if possible. Furthermore, crosses represent a poor condition where neck damage was observed in not less than eight loops.

A leaning property resulting from high loop bonding was evaluated as follows. That is, 800 high loops were joined to the single layer chip under a condition such that the wire length was about 2.5 mm, and the loop height was about 400 μm. The evaluation was then carried out by counting the number of loops whose upstanding sections (heat-affected sections) were leaning. In a column titled "High loop leaning" in the Tables, double circles represent a favorable condition where none of the loops was leaning as above. Further, circles represent a condition that is problem-free in terms of practical use, where not more than two loops were leaning as above. Furthermore, triangles represent a condition where three to five loops were leaning as above, the condition requiring that improvements be made if possible. Furthermore, crosses represent a poor condition where not less than six loops were leaning as above.

A high-temperature reliability of the ball-bonded portion was evaluated as follows. That is, wire bonding was first performed on the conventional multilayer chip, followed by sealing the same with a commercially available green resin. A sample thus obtained was then heated at a temperature of 175° C. for 2,000 hours, followed by evaluating electric properties of 50 wires bonded thereto. In a column titled "175° C. for 2000 h" in the Tables, crosses represent a poor bonded condition where not less than 30% of the wires had had electric resistances thereof tripled or more as compared to initial values. Further, triangles represent a condition where not less than 5% but less than 30% of the wires had had the electric resistances thereof tripled or more, the condition indicating that the corresponding wires could be used in IC with no strict reliability requirements. Furthermore, circles represent a condition that is problem-free in terms of practical use, where while less than 5% of the wires had had the electric resistances thereof tripled or more, not less than 10% but less than 30% of them had had the electric resistances thereof multiplied by 1.5 or more. Furthermore, double circles represent a favorable condition where less than 10% of the wires had had the electric resistances thereof multiplied by 1.5 or more.

A high-humidity reliability of the ball-bonded portion was evaluated as follows. That is, wire bonding was first performed on the conventional multilayer chip, followed by sealing the same with a commercially available green resin. A sample thus obtained was then heated at a temperature of 130° C. and a relative humidity (RH) of 85%, for 500 hours. Later, the resin was removed by an unsealing device, followed by carrying out a comparative evaluation between an average value of bonding strengths of 40 ball-bonded portions and an average value of initial bonding strengths of the 40 ball-bonded portions. In a column titled "130° C./85% RH-500h" in the Tables, double circles represent a favorable condition where the bonding strengths measured after performing the high-humidity heating were as much as 90% or higher of the initial bonding strengths. Further, circles represent a condition that is problem-free in terms of practical use, where the bonding strengths measured after performing the high-humidity heating were as much as not lower than 70% but lower than 90% of the initial bonding strengths. Furthermore, triangles represent a condition where the bonding strengths measured after performing the high-humidity heating were as much as not lower than 50% but lower than 70% of the initial bonding strengths, the condition indicating a possible usage in IC with no strict reliability requirements. Furthermore, crosses represent a condition of poor reliability, where the bonding strengths measured after performing the high-humidity heating were as much as lower than 50% of the initial bonding strengths.

Table 1A, Table 1B and Table 2 show the evaluation results and comparative examples of the ball-bonded portion formed with the multilayer copper bonding wire of the present invention. The bonding structure of claim 1 corresponds to working examples 1-30. The bonding structure of claim 2 corresponds to working examples 1, 3-5 and 7-30. The bonding structure of claim 3 corresponds to working examples 2-29. The bonding structure of claim 4 corresponds to working examples 2-21 and 23-29. The bonding structure of claim 5 corresponds to working examples 14-20 and 27-30. The bonding structure of claim 6 corresponds to working examples 21-30. The bonding structure of claim 7 corresponds to working examples 1-13. The bonding structure of claim 8 corresponds to working examples 4, 18, 23, 26 and 29. The bonding structure of claim 9 corresponds to working examples 3-17, 19 and 21-29. The bonding structure of claim 10 corresponds to working examples 2-30. The bonding structure of claim 11 corresponds to working examples 1-29. The bonding structure of claim 12 corresponds to working examples 14 and 23. The bonding structure of claim 13 corresponds to working examples 4, 18, 26 and 29.

TABLE 1A

| | | First concentrated portion | | | | Second concentrated portion | Rate at which total area of first and second concentrated portions occupies bonded cross-sectional area (%) | Third concentrated portion thickness/μm | Concentration component (value in concentration ratio, common to first to third concentrated portions) | Bondability | | | | | | | | | |
|---|---|---|---|---|---|---|---|---|---|---|---|---|---|---|---|---|---|---|---|
| | | Thickness (ratio to wire diameter) (%) | Concentration/mol % | Rate at which area of first concentrated portion occupies bonded cross-sectional area (%) | Areal rate of unconcentrated region on ball surface (%) | Rate at which area of second concentrated portion occupies bonded cross-sectional area (%) | | | | Low loop bondability | | | | (Conventional multilayer chip) | | | | | |
| | Existence | | | | | | | | | Loop height/μm | Neck damage | Root leaning | Stability of first pull strength | Capillary wear property | Lift-off defect | Al splash | Center defectiveness | Chip damage |
| Working example | 1 | ○ | 0.5 | 0.08 | 1 | 78 | — | 1 | — | Pd | ⊚ | ⊚ | ⊚ | △ | □ | ⊚ | ⊚ | □ | ⊚ |
| | 2 | ○ | 1 | 0.04 | 2 | 70 | — | 2 | — | Pd | ⊚ | ⊚ | ⊚ | ○ | □ | ⊚ | ○ | □ | ⊚ |
| | 3 | ○ | 5 | 0.4 | 5 | 57 | — | 5 | — | Pd | ⊚ | ⊚ | ⊚ | ⊚ | □ | ⊚ | ⊚ | □ | ⊚ |
| | 4 | ○ | 10 | 0.8 | 8 | 36 | — | 8 | — | Au/Pd = 0.01 | ⊚ | ⊚ | ⊚ | ⊚ | □ | ⊚ | ⊚ | □ | ⊚ |
| | 5 | ○ | 15 | 1 | 10 | 40 | — | 10 | — | Pd | ⊚ | ⊚ | ⊚ | ⊚ | □ | ⊚ | ⊚ | □ | ⊚ |
| | 6 | ○ | 11 | 7 | 18 | 38 | — | 18 | — | Ag | ⊚ | ⊚ | ⊚ | ⊚ | □ | ⊚ | ⊚ | □ | ⊚ |
| | 7 | ○ | 2 | 0.8 | 5 | 55 | — | 5 | — | Pd | ⊚ | ⊚ | ⊚ | ⊚ | □ | ⊚ | ⊚ | □ | ⊚ |
| | 8 | ○ | 23 | 1.5 | 15 | 43 | — | 15 | — | Au | ⊚ | ⊚ | ⊚ | ⊚ | □ | ⊚ | ⊚ | □ | ⊚ |
| | 9 | ○ | 38 | 2 | 18 | 35 | — | 18 | — | Pd | ⊚ | ⊚ | ⊚ | ⊚ | □ | ⊚ | ⊚ | □ | ⊚ |
| | 10 | ○ | 40 | 5 | 15 | 25 | — | 15 | — | Pd | ⊚ | ⊚ | ⊚ | ⊚ | □ | ⊚ | ⊚ | □ | ⊚ |
| | 11 | ○ | 45 | 1 | 22 | 15 | — | 22 | — | Pt | ⊚ | ⊚ | ⊚ | ⊚ | □ | ⊚ | ⊚ | □ | ⊚ |
| | 12 | ○ | 47 | 4 | 25 | 12 | — | 25 | — | Pd | ⊚ | ⊚ | ⊚ | ⊚ | □ | ⊚ | ⊚ | □ | ⊚ |
| | 13 | ○ | 50 | 8 | 28 | 8 | — | 28 | — | Pd | ⊚ | ⊚ | ⊚ | ⊚ | □ | ⊚ | ⊚ | □ | ⊚ |
| | 14 | ○ | 4 | 0.2 | 6 | 70 | 2 | 8 | — | Ag/Pd = 0.45 | ⊚ | ⊚ | ⊚ | ⊚ | □ | ⊚ | ⊚ | □ | ⊚ |
| | 15 | ○ | 11 | 0.8 | 10 | 65 | 5 | 15 | — | Pd | ⊚ | ⊚ | ⊚ | ⊚ | □ | ⊚ | ⊚ | □ | ⊚ |
| | 16 | ○ | 18 | 1 | 18 | 55 | 15 | 33 | — | Ag/Au = 0.3 | ⊚ | ⊚ | ⊚ | ⊚ | □ | ⊚ | ⊚ | □ | ⊚ |
| | 17 | ○ | 21 | 2 | 15 | 24 | 32 | 47 | — | Pd | ⊚ | ⊚ | ⊚ | ⊚ | □ | ⊚ | ⊚ | □ | ⊚ |
| | 18 | ○ | 16 | 1.2 | 25 | 32 | 46 | 71 | — | Ag/Pd = 0.1 | ⊚ | ⊚ | ⊚ | ⊚ | ⊚ | ⊚ | ⊚ | □ | ⊚ |
| | 19 | ○ | 12 | 0.7 | 18 | 60 | 42 | 60 | — | Pd | ⊚ | ⊚ | ○ | ○ | □ | ○ | ○ | □ | ○ |
| | 20 | ○ | 15 | 1 | 15 | 38 | 57 | 72 | — | Pd | ⊚ | ⊚ | ⊚ | ⊚ | □ | ⊚ | ⊚ | □ | △ |
| | 21 | ○ | 13 | 0.8 | 18 | 33 | — | 18 | 0.02 | Pd | ⊚ | ⊚ | ⊚ | ⊚ | □ | ⊚ | ⊚ | □ | ⊚ |
| | 22 | ○ | 42 | 1.3 | 36 | 0 | — | 36 | 0.1 | Pd | ⊚ | ⊚ | ○ | ⊚ | □ | ⊚ | ⊚ | □ | ⊚ |
| | 23 | ○ | 25 | 1 | 30 | 22 | — | 30 | 1.1 | Au/Pd = 0.4 | ⊚ | ⊚ | ⊚ | ⊚ | □ | ⊚ | ⊚ | □ | ⊚ |
| | 24 | ○ | 18 | 2.2 | 24 | 45 | — | 24 | 3.1 | Pd | ⊚ | ⊚ | ⊚ | ⊚ | □ | ⊚ | ⊚ | □ | ⊚ |
| | 25 | ○ | 8 | 1 | 12 | 60 | — | 12 | 4.2 | Ag/Pd = 0.3 | ⊚ | ⊚ | ⊚ | ⊚ | ⊚ | ⊚ | ⊚ | ⊚ | ⊚ |
| | 26 | ○ | 3 | 0.3 | 6 | 75 | — | 6 | 6.2 | Pd | ⊚ | ⊚ | ⊚ | ⊚ | □ | ○ | ○ | □ | ○ |
| | 27 | ○ | 4 | 0.5 | 8 | 68 | 25 | 33 | 1.8 | Au | ⊚ | ⊚ | ⊚ | ⊚ | □ | ⊚ | ⊚ | □ | △ |
| | 28 | ○ | 35 | 1 | 15 | 54 | 30 | 45 | 0.3 | Pd | ⊚ | ⊚ | ⊚ | ⊚ | □ | ⊚ | ⊚ | □ | ⊚ |
| | 29 | ○ | 48 | 1.5 | 30 | 5 | 40 | 70 | 2.8 | Au/Pd = 0.7 | ⊚ | ⊚ | ⊚ | ⊚ | □ | ⊚ | ⊚ | □ | ⊚ |
| | 30 | ○ | 55 | 1.7 | 35 | 23 | 42 | 77 | 4 | Pd | ⊚ | ⊚ | ⊚ | ⊚ | ⊚ | ⊚ | ⊚ | ⊚ | ⊚ |
| Comparative example | 1 | × | 0 | 0 | 0 | 100 | — | 0 | — | Pd | × | × | × | △ | △ | △ | ⊚ | △ | ⊚ |
| | 2 | × | 0 | 0 | 0 | 67 | 12 | 12 | — | Pt | × | × | × | △ | △ | △ | ⊚ | ○ | ⊚ |
| | 3 | × | 0 | 0 | 0 | 52 | 48 | 48 | — | Pd | × | × | × | △ | △ | △ | ⊚ | △ | ⊚ |
| | 4 | × | 0 | 0 | 0 | 15 | 0 | 0 | 2.8 | Ag/Pd = 0.2 | × | × | × | △ | △ | △ | ⊚ | △ | ⊚ |
| | 5 | × | 0 | 0 | 0 | 21 | 16 | 16 | 1.7 | Pd | × | × | × | △ | △ | △ | ⊚ | ○ | ⊚ |

TABLE 1B

| | | (Overhang-type multilayer chip) | | | (FOW-type multilayer chip) Ball-bonded shape | | | (Single layer chip) | | | (Conventional multilayer chip) Bonding reliability | |
|---|---|---|---|---|---|---|---|---|---|---|---|---|
| | | Ball bonding strength | | Stability of pressed-ball height | Lift-off defect | Second layer | Third layer | Stability of pressed-ball height | Low loop bondability at long span | High loop leaning | Al Splash | 175° C.-2000 h | 130° C. 85% RH-500 h |
| | | 170° C. | 150° C. | | | | | | | | | | |
| Working example | 1 | ◎ | △ | ○ | ◎ | ○ | ○ | ○ | ◎ | ◎ | ○ | △ | △ |
| | 2 | ○ | △ | ○ | ◎ | ◎ | ○ | ○ | ◎ | ◎ | ◎ | △ | △ |
| | 3 | ◎ | ○ | ◎ | ◎ | ◎ | ◎ | ○ | ◎ | ◎ | ◎ | △ | △ |
| | 4 | ◎ | ◎ | ◎ | ◎ | ◎ | ◎ | ○ | ◎ | ◎ | ◎ | △ | △ |
| | 5 | ◎ | ◎ | ◎ | ◎ | ◎ | ◎ | ○ | ◎ | ◎ | ◎ | △ | △ |
| | 6 | ○ | △ | ◎ | ◎ | ◎ | ◎ | ◎ | ◎ | ◎ | ◎ | △ | △ |
| | 7 | ◎ | ◎ | ◎ | ◎ | ◎ | ○ | ○ | ◎ | ◎ | ◎ | △ | △ |
| | 8 | ◎ | ◎ | ◎ | ◎ | ◎ | ◎ | ◎ | ◎ | ◎ | ◎ | △ | △ |
| | 9 | ◎ | ◎ | ◎ | ◎ | ◎ | ◎ | ◎ | ◎ | ◎ | ◎ | △ | △ |
| | 10 | ◎ | △ | ◎ | ◎ | ◎ | ◎ | ◎ | ◎ | ◎ | ◎ | △ | △ |
| | 11 | ◎ | ◎ | ◎ | ◎ | ◎ | ○ | ◎ | ◎ | ◎ | ◎ | △ | △ |
| | 12 | ◎ | ◎ | ◎ | ◎ | ◎ | ○ | ◎ | ◎ | ◎ | ◎ | △ | △ |
| | 13 | ◎ | ◎ | ◎ | ◎ | ◎ | ○ | ◎ | ◎ | ◎ | ○ | △ | △ |
| | 14 | ◎ | ○ | ◎ | ○ | ◎ | ◎ | ○ | ◎ | ◎ | ◎ | △ | △ |
| | 15 | ◎ | ◎ | ◎ | ○ | ◎ | ◎ | ◎ | ◎ | ◎ | ◎ | △ | △ |
| | 16 | ◎ | ◎ | ◎ | ○ | ◎ | ◎ | ◎ | ◎ | ◎ | ◎ | △ | △ |
| | 17 | ◎ | ◎ | ◎ | ○ | ◎ | ◎ | ◎ | ◎ | ◎ | ◎ | △ | △ |
| | 18 | ◎ | ◎ | ○ | ○ | ◎ | ◎ | ○ | ◎ | ◎ | ◎ | △ | △ |
| | 19 | ◎ | ◎ | ◎ | ○ | ◎ | ◎ | ○ | ◎ | ◎ | ◎ | △ | △ |
| | 20 | ◎ | ◎ | ○ | ○ | ◎ | ◎ | ○ | ◎ | ◎ | ◎ | △ | △ |
| | 21 | ◎ | ◎ | ◎ | ○ | ◎ | ◎ | ◎ | ◎ | ◎ | ◎ | ○ | ○ |
| | 22 | ◎ | ◎ | ◎ | ○ | ◎ | ○ | ◎ | ◎ | ◎ | ○ | ◎ | ○ |
| | 23 | ◎ | ◎ | ◎ | ○ | ◎ | ◎ | ◎ | ◎ | ◎ | ◎ | ◎ | ◎ |
| | 24 | ◎ | ◎ | ◎ | ○ | ◎ | ◎ | ◎ | ◎ | ◎ | ◎ | ◎ | ◎ |
| | 25 | ◎ | ◎ | ◎ | ○ | ◎ | ◎ | ○ | ◎ | ◎ | ◎ | ◎ | ○ |
| | 26 | ◎ | ○ | ◎ | ○ | ◎ | ◎ | ○ | ◎ | ◎ | ○ | ○ | ○ |
| | 27 | ◎ | ◎ | ◎ | ○ | ◎ | ◎ | ◎ | ◎ | ◎ | ◎ | ◎ | ◎ |
| | 28 | ◎ | ◎ | ◎ | ○ | ◎ | ◎ | ◎ | ◎ | ◎ | ◎ | ◎ | ◎ |
| | 29 | ◎ | ◎ | ◎ | ○ | ◎ | ○ | ◎ | ◎ | ◎ | ◎ | ◎ | ◎ |
| | 30 | ◎ | ◎ | ○ | ○ | ○ | ○ | ○ | ◎ | ○ | ◎ | ◎ | ◎ |
| Comparative example | 1 | △ | × | △ | △ | △ | × | × | △ | △ | ◎ | △ | △ |
| | 2 | △ | × | ◎ | △ | △ | × | △ | △ | △ | ◎ | △ | △ |
| | 3 | △ | × | ◎ | △ | △ | × | ○ | △ | △ | ◎ | △ | △ |
| | 4 | △ | × | △ | △ | △ | × | × | △ | △ | ◎ | ◎ | ◎ |
| | 5 | △ | × | ◎ | △ | △ | × | ○ | △ | △ | ◎ | ◎ | ◎ |

TABLE 2

| | | Ball formation method | | | | | Multilayer bonding wire | | | | | | | | | Film thickness of Cu oxide, organic substance on core member surface/nm |
|---|---|---|---|---|---|---|---|---|---|---|---|---|---|---|---|---|
| | | Spraying method P: Shielding pipe S: Front pipe Q: Sealed shielding pipe T: Bidirectional pipe | Gas type | Flow rate (ml/min) | | Size of vertical through hole | Wire diameter/μm | Outer layer | | Diffusion layer Thickness/μm | Ratio of diffusion layer thickness to outer layer thickness | Concentrated layer | | | Outer layer surface | |  |
| | | | | Shielding pipe/Rear pipe | Front pipe | | | Component (value in concentration ratio) | Thickness/μm | | | Component, Concentration (mol %) | Location: topmost surface or outer layer/core interface | Cu concentration (mol %) | Thickness of Cu oxide/nm |  |
| Working example | 1 | P | N2 | 0.5 | — | 2.5 | 18 | Pd | 0.005 | 0.01 | 2.00 | — | — | 4 | 4 | 0.1 |
| | 2 | P | N2 | 0.6 | — | 2.5 | 18 | Pd | 0.02 | 0.02 | 1.00 | — | — | 2 | 4 | 0.3 |
| | 3 | P | N2 | 0.4 | — | 1.3 | 20 | Pd | 0.04 | 0.03 | 0.75 | — | — | 1.7 | 3 | 0.3 |
| | 4 | P | N2 | 0.6 | — | 1.3 | 18 | Au/Pd = 0.02 | 0.05 | 0.03 | 0.60 | Au 40 | Topmost surface | 1.4 | 2 | 0.5 |
| | 5 | P | N2 | 0.4 | — | 2 | 18 | Pd | 0.06 | 0.04 | 0.67 | — | — | 0 | 1 | 0.8 |
| | 6 | P | N2 | 0.5 | — | 2 | 18 | Ag | 0.08 | 0.07 | 0.88 | — | — | 1 | 1 | 1 |
| | 7 | P | N2 + 5% H2 | 0.6 | — | 2 | 18 | Pd | 0.1 | 0.06 | 0.60 | — | — | 1 | — | 1.5 |
| | 8 | P | N2 | 0.7 | — | 2 | 18 | Au | 0.11 | 0.06 | 0.55 | — | — | 0.8 | 0.8 | 1.8 |
| | 9 | P | N2 | 0.7 | — | 1.6 | 18 | Pd | 0.13 | 0.08 | 0.62 | — | — | 0.2 | 0.5 | 2.4 |
| | 10 | P | N2 | 0.7 | — | 1.6 | 18 | Pd | 0.15 | 0.08 | 0.53 | — | — | 0.1 | 0.2 | 2.7 |
| | 11 | P | N2 | 0.8 | — | 1.6 | 25 | Pt | 0.2 | 0.1 | 0.50 | — | — | 0 | 0.1 | 3 |
| | 12 | P | N2 | 0.8 | — | 1.6 | 18 | Pd | 0.23 | 0.11 | 0.48 | — | — | 0 | 0 | 4 |
| | 13 | P | N2 + 5% H2 | 1 | — | 1.6 | 18 | Pd | 0.3 | 0.14 | 0.47 | — | — | 0 | 0 | 5 |
| | 14 | S | N2 | 0.4 | 0.3 | 2.5 | 18 | Ag/Pd = 0.45 | 0.2 | 0.003 | 0.04 | Ag 50 | Outer layer/Core interface | 3 | 3 | 0.6 |
| | 15 | S | N2 | 0.4 | 0.4 | — | 18 | Pd | 0.3 | 0.004 | 0.01 | — | — | 1.7 | 1.5 | 0.5 |
| | 16 | Q | N2 | 0.6 | 0.6 | 2 | 18 | Ag/Au = 0.35 | 0.06 | 0.03 | 0.50 | Au 80 | Topmost surface | 1 | 0.8 | 0.5 |
| | 17 | Q | N2 | 0.6 | — | — | 18 | Pd | 0.08 | 0.04 | 0.50 | — | — | 0.4 | 0.6 | 0.4 |
| | 18 | Q | N2 | 0.7 | 0.6 | 2 | 18 | Au/Pd = 0.06 | 0.15 | 0.07 | 0.47 | Au 70 | Topmost surface | 0.1 | 0.4 | 0.3 |
| | 19 | S | N2 | 0.7 | — | — | 20 | Pd | 0.23 | 0.11 | 0.48 | — | — | 0.2 | 0.3 | 0.3 |
| | 20 | Q | N2 | 0.9 | 0.5 | 1.6 | 18 | Pd | 0.25 | 0.13 | 0.52 | — | — | 0.2 | 0.5 | 0.2 |
| | 21 | T | N2 | 0.8 | — | — | 18 | Pd | 0.05 | 0.01 | 0.20 | — | — | 0.4 | 0.4 | 0.1 |
| | 22 | T | N2 + 5% H2 | 0.8 | 0.5 | 1.3 | 18 | Pd | 0.08 | 0.02 | 0.25 | — | — | 0 | 0 | 0.2 |
| | 23 | Q | N2 | 0.6 | — | — | 22 | Au/Pd = 0.4 | 0.09 | 0.02 | 0.22 | Au 28 | Outer layer/Core interface | 0 | 0 | 0.1 |
| | 24 | T | N2 | 0.7 | — | 1.6 | 18 | Pd | 0.12 | 0.03 | 0.25 | — | — | 0.1 | 0.1 | 0.1 |
| | 25 | Q | N2 | 0.4 | 0.3 | 2.5 | 18 | Pt | 0.12 | 0.04 | 0.33 | — | — | 0.2 | 0.4 | 0.05 |
| | 26 | T | N2 | 0.4 | — | — | 18 | Ag/Pd = 0.35 | 0.15 | 0.06 | 0.40 | Ag 25 | Topmost surface | 1.2 | 1 | 0.06 |
| | 27 | T | N2 | 0.4 | — | 1.3 | 18 | Au | 0.15 | 0.12 | 0.80 | — | — | 1.8 | 2 | 0.08 |
| | 28 | Q | N2 | 0.6 | — | — | 18 | Pd | 0.2 | 0.15 | 0.75 | — | — | 0.5 | 0.3 | 0.1 |
| | 29 | T | N2 + 5% H2 | 0.7 | 0.5 | 2.5 | 18 | Au/Pd = 0.12 | 0.32 | 0.2 | 0.63 | Au 20 | Topmost surface | 0 | 0.01 | 0.2 |
| | 30 | T | N2 | 0.6 | 0.6 | — | 18 | Pd | 0.4 | 0.26 | 0.65 | — | — | 0 | 0 | 0.4 |
| Comparative example | 1 | P | N2 | 0.6 | — | 2.5 | 18 | Pd | 0.01 | 0.01 | 1.00 | — | — | 5 | 5.5 | 0.2 |
| | 2 | T | N2 | 0.3 | 0.3 | — | 18 | Pt | 0.05 | 0.03 | 0.60 | — | — | 4 | 2.3 | 0.3 |
| | 3 | Q | N2 | 0.4 | — | 2.5 | 18 | Pd | 0.02 | 0.14 | 7.00 | — | — | 3 | 4.5 | 0.4 |
| | 4 | P | N2 + 5% H2 | 0.5 | 0.5 | 2.5 | 20 | Ag/Pd = 0.35 | 0.08 | 0.01 | 0.13 | Ag 30 | Outer layer/Core interface | 3 | 3.2 | 0.2 |
| | 5 | T | N2 | 0.4 | 0.5 | — | 18 | Pd | 0.1 | 0.02 | 0.20 | — | — | 4 | 2.8 | 0.1 |

Figure 14:
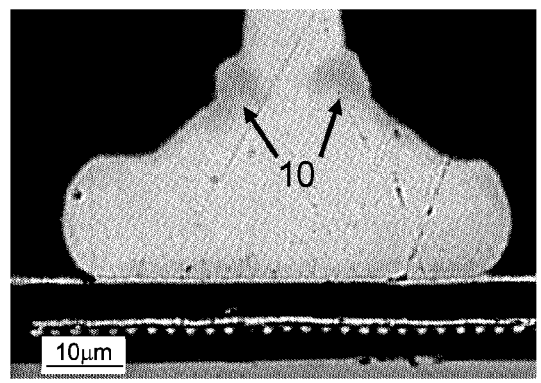
FIG. 14 is a cross-sectional photograph that is taken on the X-X direction in FIG. 2 and shows the concentrated portion located in the ball terminal section in the working example of the present invention.

Bonding structures of working examples 1-30 correspond to the structure of the ball-bonded portion described in claim 1 of the present invention, the ball-bonded portion being formed with the multilayer copper bonding wire having the outer layer that is mainly composed of at least one of the noble metals including Pd, Au, Ag and Pt. Particularly, the following was confirmed. That is, since the first concentrated portion 10 of the aforementioned noble metal(s) was formed in the ball-root region, not only, for example, favorable low loop bondabilities and neck-damage control properties could be achieved with multilayer chips, but a favorable ball bonding strength could also be achieved after performing wire bonding on the overhang-type multilayer chip at a normal bonding temperature of 170° C. Meanwhile, as for comparative examples 1-5, it was confirmed that since the first concentrated portion 10 was not formed as above, neck damages had occurred, thus making it difficult to accomplish low loop bonding and resulting in a low ball bonding strength. FIG. 14 is a cross-sectional photograph showing a ball-bonded portion of working example 10, where the first concentrated portion 10 has been formed. Here, although FIG. 14 is a SEM photograph, identification of the first concentrated portion 10 was actually not carried out through FIG. 14, but was carried arbitrarily through, for example, elemental analysis methods such as EPMA, EDX and AES, or through color identification by an optical microscope.

As for bonding structures of working examples 1, 3-5 and 7-30, it was confirmed that since the total concentration of the aforementioned noble metal(s) in the first concentrated portion 10 was not lower than 0.05 mol % and not higher than 6 mol % as described in claim 2 of the present invention, a further improved ball bonding strength had been achieved after performing wire bonding on the overhang-type multilayer chip at the normal bonding temperature of 170° C. Preferably, as for working examples 3-5, 7-9 and 11-30 where the aforementioned concentration was not lower than 0.2 mol % and not higher than 4 mol %, a favorable ball bonding strength was confirmed after performing wire bonding on the overhang-type multilayer chip at a low bonding temperature of 150° C. More preferably, as for working examples 4, 5, 7-9, 11-13, 15-25 and 27-30 where the aforementioned concentration was not lower than 0.5 mol % and not higher than 3 mol %, there was confirmed a high effect of improving the ball bonding strength when employing the low bonding temperature of 150° C.

Bonding structures of working examples 2-29 correspond to that described in claim 3 of the present invention. That is, it was confirmed that since a thickness of the first concentrated portion 10 was not less than 1% and not more than 50% of the wire diameter, the ball-bonded portions formed on a second-layer semiconductor chip of the FOW-type multilayer chip had exhibited favorable shapes. Preferably, as for working examples 3-6, 8-10, 14-21 and 23-28 where the aforementioned thickness was not less than 3% and not more than 40% of the wire diameter, it was confirmed that the ball-bonded portions formed on a third-layer semiconductor chip of the FOW-type multilayer chip had exhibited favorable shapes.

Bonding structures of working examples 2-21 and 23-29 correspond to that described in claim 4 of the present invention. That is, a favorable root leaning property was confirmed with the conventional multilayer chip due to the fact that the total area of the first concentrated portion 10 occupied not less than 2% and not more than 30% of the cross-sectional area of the ball-bonded portion.

Figure 15:
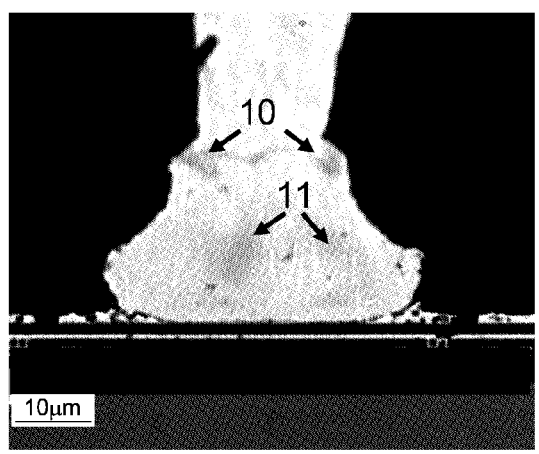
FIG. 15 is a cross-sectional photograph that is taken on the X-X direction in FIG. 2 and shows: the concentrated portion located in the ball terminal section; and the concentrated portion inside the ball portion, in the working example of the present invention.

Bonding structures of working examples 14-20 and 27-30 correspond to that described in claim 5 of the present invention. That is, it was confirmed that the ball-bonded portions formed on the multilayer chips had exhibited favorable conditions in terms of center defectiveness, due to the fact that the second concentrated portion 11 of the aforementioned noble metal(s) was formed in at least one location inside the ball-bonded portion. Preferably, as for working examples 15-19 and 27-30 where a total area of the second concentrated portion 11 occupied not less than 3% and not more than 50% of the cross-sectional area of the ball-bonded portion, a high effect of further controlling the center defectiveness was confirmed. FIG. 15 is a cross-sectional photograph showing a ball-bonded portion of working example 17, where the first concentrated portion 10 and the second concentrated portion 11 have been formed. Here, although FIG. 15 is a SEM photograph, identifications of the first concentrated portion 10 and the second concentrated portion 11 were actually not carried out through FIG. 15, but were carried arbitrarily through, for example, elemental analysis methods such as EPMA, EDX and AES, or through color identification by an optical microscope.

Figure 16:
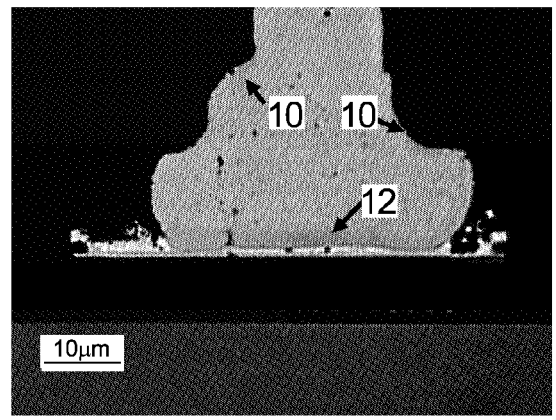
FIG. 16 is a cross-sectional photograph that is taken on the X-X direction in FIG. 2 and shows: the concentrated portion located in the ball terminal section; and the concentrated portion formed in the bonded interface, in the working example of the present invention.

Bonding structures of working examples 21-30 correspond to that described in claim 6 of the present invention. Here, the following was confirmed. That is, since the highly-concentrated third concentrated portion 12 of the aforementioned noble metal(s) was formed in the bonded interface of the ball-bonded portion, a favorable bonding reliability could then be achieved in the accelerated test where the conventional multilayer chip was heated either at the high temperature of 175° C. for 2,000 hours, or at the temperature of 130° C. and the high relative humidity (RH) of 85% for 500 hours. Preferably, as for working examples 22-25 and 27-30 where a thickness of the third concentrated portion 12 was within a range of not smaller than 0.03 μm and not larger than 6 μm, there can be achieved a high effect of improving reliabilities that have been affected through high-temperature heating. More preferably, as for working examples 23, 24 and 27-30 where the thickness of the third concentrated portion 12 was within a range of not smaller than 0.2 μm and not larger than 4 μm, there can be achieved a higher effect of improving reliabilities that have been affected through high-humidity heating. FIG. 16 is a cross-sectional photograph showing a ball-bonded portion of working example 25, where the first concentrated portion 10 and the third concentrated portion 12 have been formed. Here, although FIG. 16 is a SEM photograph, identifications of the first concentrated portion 10 and the third concentrated portion 12 were actually not carried out through FIG. 16, but were carried arbitrarily through, for example, elemental analysis methods such as EPMA, EDX and AES, or through color identification by an optical microscope.

Bonding structures of working examples 1-13 correspond to that described in claim 7 of the present invention. That is, a favorable lift-off property was confirmed with the conventional multilayer chip and the overhang-type multilayer chip, due to the fact that the first concentrated portion only existed in the ball-root region of the surface region of the ball-bonded portion.

Bonding structures of working examples 4, 18, 23, 26 and 29 correspond to that described in claim 8 of the present invention. That is, a favorable capillary wear property was confirmed with the conventional multilayer chip, due to the fact that there were used two or more noble metals including Pd and at least one of Au and Ag, and the fact that the ratio of the total concentration of Au, Ag to the Pd concentration was not lower than 0.01 and not higher than 0.4 in the first concentrated portion 10. Here, a method used to measure the aforementioned concentration ratio was as follows. That is, random concentrations were first measured at not less than five locations in the first concentrated portion 10, such that an average value of concentration ratios obtained in the aforementioned locations could then be obtained and used.

Bonding structures of working examples 3-17, 19 and 21-29 correspond to that described in claim 9 of the present invention. That is, a favorable stability of the pressed-ball height was confirmed with the overhang-type multilayer chip, due to the fact that the total area of the first concentrated portion 10 and the second concentrated portion 12 occupied not less than 5% and not more than 70% of the cross-sectional area of the ball-bonded portion. Preferably, as for working examples 6, 8-13, 15-17, 21-24 and 27-28 where the total area of the first concentrated portion 10 and the second concentrated portion 12 occupied not less than 15% and not more than 60% of the cross-sectional area of the ball-bonded portion, there was confirmed a higher effect of improving the stability of the pressed-ball height in the FOW-type multilayer chip.

Bonding structures of working examples 2-30 correspond to that described in claim 10 of the present invention. That is, a favorable stability of the first pull strength was confirmed with the conventional multilayer chip, due to the fact that the thickness of the outer layer of the aforementioned multilayer copper bonding wire was within the range of not smaller than 0.01 µm and not larger than 0.4 µm.

Bonding structures of working examples 1-29 correspond to that described in claim 11 of the present invention. That is, a favorable leaning property was confirmed when performing high loop bonding on the single layer chip. This was because the diffusion layer having the concentration gradient of copper and at least one of the aforementioned noble metals existed between the outer layer of the multilayer copper bonding wire and the core member thereof, and the thickness of the corresponding diffusion layer was not smaller than 0.003 µm and not larger than 0.15 µm.

Bonding structures of working examples 14 and 23 correspond to that described in claim 12 of the present invention. That is, a favorable capillary wear property was confirmed with the conventional multilayer chip due to the fact that the outer layer of the multilayer copper bonding wire was mainly composed of Pd, and the fact that the concentrated layer of at least one of Au and Ag was formed in the interface between the aforementioned outer layer and core member.

Bonding structures of working examples 4, 18, 26 and 29 correspond to that described in claim 13 of the present invention. That is, there was achieved a high effect of further improving the capillary wear property when using the conventional multilayer chip, due to the fact that the outer layer of the multilayer copper bonding wire was mainly composed of Pd, and the fact that the surface of the aforementioned outer layer includes the concentrated layer of at least one of Au and Ag.

DESCRIPTION OF THE SYMBOLS

1 multilayer copper bonding wire
2 ball portion
3 ball-bonded portion
4 semiconductor chip
5 substrate (resin, lead frame)
6 spacer
7 FOW resin
8 electrode film
9 ball-root region
10 first concentrated region
11 second concentrated region
12 third concentrated region
13 terminal concentrated portion of initial ball portion
14 inner concentrated portion of initial ball portion
15 surface concentrated portion of initial ball portion
16 electrode torch
21 core member
22 outer layer
51 electrode torch
52 shielding pipe
53 vertical through hole
54 gas flow
55 arc discharge
56 rear pipe
57 front pipe

The invention claimed is:

1. A bonding structure of a ball-bonded portion obtained by bonding to a bonding-target portion a ball portion formed on a front end of a multilayer copper bonding wire, wherein
said multilayer copper bonding wire comprises:
a core member mainly composed of copper; and
an outer layer formed on said core member and mainly composed of at least one noble metal selected from the group of Pd, Au, Ag and Pt,
wherein said bonding structure comprises a first concentrated portion having a high total noble metal level and being formed in a ball-root region, said ball-root region being in such a surface region of said ball-bonded portion as is located at a boundary with said multilayer copper bonding wire,
wherein said high total noble metal level accounts for all of said noble metals selected, and
wherein a total concentration of said at least one noble metal selected in said first concentrated portion is not lower than 0.05 mol % and not higher than 6 mol %.

2. The bonding structure according to claim 1, wherein a thickness of said first concentrated portion formed in said ball-root region is not less than 1% and not more than 50% of a wire diameter, when observed on a cross section of said ball-bonded portion taken along a plane orthogonal to a bonded interface between said ball-bonded portion and said bonding-target portion.

3. The bonding structure according to claim 1, wherein a total area of said first concentrated portion formed in said ball-root region occupies not less than 2% and not more than 30% of a cross-sectional area of said ball-bonded portion, when observed on said cross section of said ball-bonded portion taken along said plane orthogonal to said bonded interface between said ball-bonded portion and said bonding-target portion.

4. The bonding structure according to claim 1, wherein only said first concentrated portion exists in said surface region of said ball-bonded portion, when observed on said cross section of said ball-bonded portion taken along said plane orthogonal to said bonded interface between said ball-bonded portion and said bonding-target portion.

5. The bonding structure according to claim 1, wherein said at least one noble metal includes two or more kinds of noble metals in total that are Pd and at least one of Au and Ag, and a ratio of a total concentration of Au and Ag to a Pd concentration is not lower than 0.01 and not higher than 0.4.

6. The bonding structure according to claim 1, wherein said outer layer of said multilayer copper bonding wire is formed to a thickness of not smaller than 0.01 µm and not larger than 0.4 µm.

7. The bonding structure according to claim 1, wherein a diffusion layer having a concentration gradient of copper and said at least one noble metal is formed between said outer layer and core member of said multilayer copper bonding wire, said diffusion layer being formed to a thickness of not smaller than 0.003 µm and not larger than 0.15 µm.

8. The bonding structure according to claim 1, wherein said outer layer of said multilayer copper bonding wire is mainly composed of Pd, and a concentrated layer of at least one of Au and Ag is formed in an interface between said outer layer and said core member.

9. The bonding structure according to claim 1, wherein said outer layer of said multilayer copper bonding wire is mainly composed of Pd, and a concentrated layer of at least one of Au and Ag is formed on a surface of said outer layer.

10. A bonding structure of a ball-bonded portion obtained by bonding to a bonding-target portion a ball portion formed on a front end of a multilayer copper bonding wire, wherein
said multilayer copper bonding wire comprises:
a core member mainly composed of copper; and
an outer layer formed on said core member and mainly composed of at least one noble metal selected from the group of Pd, Au, Ag and Pt, wherein
said bonding structure comprises:
a first concentrated portion having a high total noble metal level and being formed in a ball-root region, said ball-root region being in such a surface region of said ball-bonded portion as is located at a boundary with said multilayer copper bonding wire; and
a second concentrated portion in which said at least one noble metal is highly concentrated, said second concentrated portion being formed in at least one location inside said ball-bonded portion when observed on said cross section of said ball-bonded portion taken along said plane orthogonal to said bonded interface between said ball-bonded portion and said bonding-target portion.

11. The bonding structure according to claim 10, wherein a total area of said first concentrated portion and said second concentrated portion occupies not less than 5% and not more than 70% of said cross-sectional area of said ball-bonded portion, when observed on said cross section of said ball-bonded portion taken along said plane orthogonal to said bonded interface.

12. The bonding structure according to claim 10, further comprising a third concentrated portion in which said at least one noble metal is highly concentrated, said third concentrated portion being formed in said bonded interface between said ball-bonded portion and said bonding-target portion.

13. The bonding structure according to claim 10, wherein a total concentration of said at least one noble metal in said first concentrated portion is not lower than 0.05 mol % and not higher than 6 mol %.

14. The bonding structure according to claim 10, wherein a thickness of said first concentrated portion formed in said ball-root region is not less than 1% and not more than 50% of a wire diameter, when observed on a cross section of said ball-bonded portion taken along a plane orthogonal to a bonded interface between said ball-bonded portion and said bonding-target portion.

15. The bonding structure according to claim 10, wherein a total area of said first concentrated portion formed in said ball-root region occupies not less than 2% and not more than 30% of a cross-sectional area of said ball-bonded portion, when observed on said cross section of said ball-bonded portion taken along said plane orthogonal to said bonded interface between said ball-bonded portion and said bonding-target portion.

16. The bonding structure according to claim 10, wherein said at least one noble metal includes two or more kinds of noble metals in total that are Pd and at least one of Au and Ag, and a ratio of a total concentration of Au and Ag to a Pd concentration is not lower than 0.01 and not higher than 0.4.

17. The bonding structure according to claim 10, wherein said outer layer of said multilayer copper bonding wire is formed to a thickness of not smaller than 0.01 µm and not larger than 0.4 µm.

18. The bonding structure according to claim 10, wherein a diffusion layer having a concentration gradient of copper and said at least one noble metal is formed between said outer layer and core member of said multilayer copper bonding wire, said diffusion layer being formed to a thickness of not smaller than 0.003 µm and not larger than 0.15 µm.

19. The bonding structure according to claim 10, wherein said outer layer of said multilayer copper bonding wire is mainly composed of Pd, and a concentrated layer of at least one of Au and Ag is formed in an interface between said outer layer and said core member.

20. The bonding structure according to claim 10, wherein said outer layer of said multilayer copper bonding wire is mainly composed of Pd, and a concentrated layer of at least one of Au and Ag is formed on a surface of said outer layer.

21. A bonding structure of a ball-bonded portion obtained by bonding to a bonding-target portion a ball portion formed on a front end of a multilayer copper bonding wire, wherein
said multilayer copper bonding wire comprises:
a core member mainly composed of copper; and
an outer layer formed on said core member and mainly composed of at least one noble metal selected from the group of Pd, Au, Ag and Pt, wherein
said bonding structure comprises:
a first concentrated portion having a high total noble metal level and being formed in a ball-root region, said ball-root region being in such a surface region of said ball-bonded portion as is located at a boundary with said multilayer copper bonding wire; and
a third concentrated portion in which said at least one noble metal is highly concentrated, said third concentrated portion being formed in said bonded interface between said ball-bonded portion and said bonding-target portion.

22. The bonding structure according to claim 21, wherein a total concentration of said at least one noble metal in said first concentrated portion is not lower than 0.05 mol % and not higher than 6 mol %.

23. The bonding structure according to claim 21, wherein a thickness of said first concentrated portion formed in said ball-root region is not less than 1% and not more than 50% of a wire diameter, when observed on a cross section of said ball-bonded portion taken along a plane orthogonal to a bonded interface between said ball-bonded portion and said bonding-target portion.

24. The bonding structure according to claim 21, wherein a total area of said first concentrated portion formed in said ball-root region occupies not less than 2% and not more than 30% of a cross-sectional area of said ball-bonded portion, when observed on said cross section of said ball-bonded portion taken along said plane orthogonal to said bonded interface between said ball-bonded portion and said bonding-target portion.

25. The bonding structure according to claim 21, wherein said at least one noble metal includes two or more kinds of noble metals in total that are Pd and at least one of Au and Ag, and a ratio of a total concentration of Au and Ag to a Pd concentration is not lower than 0.01 and not higher than 0.4.

26. The bonding structure according to claim 21, wherein said outer layer of said multilayer copper bonding wire is formed to a thickness of not smaller than 0.01 μm and not larger than 0.4 μm.

27. The bonding structure according to claim 21, wherein a diffusion layer having a concentration gradient of copper and said at least one noble metal is formed between said outer layer and core member of said multilayer copper bonding wire, said diffusion layer being formed to a thickness of not smaller than 0.003 μm and not larger than 0.15 μm.

28. The bonding structure according to claim 21, wherein said outer layer of said multilayer copper bonding wire is mainly composed of Pd, and a concentrated layer of at least one of Au and Ag is formed in an interface between said outer layer and said core member.

29. The bonding structure according to claim 21, wherein said outer layer of said multilayer copper bonding wire is mainly composed of Pd, and a concentrated layer of at least one of Au and Ag is formed on a surface of said outer layer.

* * * * *